US005434566A

United States Patent [19]

Iwasa et al.

[11] Patent Number: 5,434,566

[45] Date of Patent: Jul. 18, 1995

[54] KEY TOUCH ADJUSTING METHOD AND DEVICE

[75] Inventors: Seiichi Iwasa; Hideyuki Motoyama, both of Kawasaki, Japan

[73] Assignee: Fujitsu Limited, Kawasaki, Japan

[21] Appl. No.: 306,735

[22] Filed: Sep. 15, 1994

Related U.S. Application Data

[63] Continuation of Ser. No. 894,947, Jun. 8, 1992, abandoned.

[30] Foreign Application Priority Data

Jun. 10, 1991 [JP] Japan .................................. 3-137722

[51] Int. Cl.[6] .......................... H03K 17/94; B41J 5/08

[52] U.S. Cl. ....................................... 341/34; 400/481

[58] Field of Search .................... 341/34, 31; 340/686; 73/862.381, 862.53, 862.541; 400/480–481; 84/439–440; 307/119; 200/5 A, 520; 364/558; 250/227.22, 222.1; 345/168

[56] References Cited

U.S. PATENT DOCUMENTS

| | | | |
|---|---|---|---|
| 4,343,557 | 8/1982 | DuRoss et al. | 400/481 X |
| 4,977,298 | 12/1990 | Fujiyama | 200/5 A |
| 5,220,318 | 6/1993 | Staley | 400/481 X |

FOREIGN PATENT DOCUMENTS

| | | |
|---|---|---|
| 0278916 | 3/1988 | European Pat. Off. . |
| 0419326 | 3/1991 | European Pat. Off. . |

OTHER PUBLICATIONS

Patent Abstracts of Japan, vol. 13, No. 578 (E-864)(3926) Dec. 20, 1989 for Japanese Application No. 12 43 325, Sep. 28, 1989.

European Search Report, The Hague, Apr. 21, 1993.

*Primary Examiner*—John K. Peng
*Assistant Examiner*—Thomas J. Mullen, Jr.
*Attorney, Agent, or Firm*—Staas & Halsey

[57] ABSTRACT

A key touch adjusting device wherein the position of a key top is detected, and a resistive force corresponding to that position is generated and applied to the key top. The numeral array for the position data and the force data is stored in a memory. To apply hysteresis to a key force profile curve, a RS flip-flop whose output is inverted by the position data is provided to generate different resistive forces in the key top depressing process and the key top returning process. Also disclosed are a method of comparing an actually obtained profile curve with a predetermined profile curve on a display device by detecting both the position of the key top and the depressing force thereof, a method of achieving hysteresis characteristics by storing a plurality of numeral arrays of the depressing force vs. the displacement in a memory of a control computer beforehand and by changing the numeral array according to the position of the key top, a mechanism for restricting a range in which the key top is displaced, and a method of generating an on/off signal corresponding to the position of the key top without using an electrical contact.

26 Claims, 25 Drawing Sheets

KEY TOUCH ADJUSTING METHOD AND DEVICE

This application is a continuation of application Ser. No. 07/894,947, filed Jun. 8, 1992, now abandoned.

BACKGROUND OF THE INVENTION

The present invention relates to a method of adjusting the key touch of a keyboard and a device which carries out the method.

In order to minimize an operator's fatigue and improve efficiency when the operator handles a keyboard serving as an input unit for word processors or computer systems, keyboards having a comfortable key touch have been desired. Major factors which affect key touch, that is, the "key feel" with which the operator depresses key tops, are the magnitude of the stroke of a key top, the resistive force which the operator receives from the key top, and a click with which the operator knows that an electric input has been completed. Which key touch consisting of the combination of these factors is desirable depends on an individual operator.

In general, keyboards are constructed of:

(1) a plurality of switches, such as electrical contacts, which are opened and closed by depressing corresponding key tops;

(2) a plurality of key tops for specifying the position of the plurality of switches on the keyboard and for transferring a depressing force to a selected switch; and (3) an electric circuit, such as an encoder or an interface, which transfers signals generated by opening and closing of the plurality of switches on the keyboard to a control unit, such as a computer.

Various types of switches can be employed depending an application or cost. Examples include a lead switch, a mechanical switch, a membrane switch in which two flexible films on which electrical contacts are formed in an opposed relation are laid on top of one another with a small gap therebetween, and a switch in which the films and contacts are replaced by a conductive rubber sheet.

FIGS. 1 and 2(*a*) and 2(*b*) are respectively a perspective view and a cross-sectional view of an example of a membrane switch which is most widely employed in a keyboard for a word processor, a personal computer or a terminal unit.

Referring first to FIG. 1, an upper film 101 made of, for example, polyester has a circuit pattern 101A and contacts 101C, while a lower film 102 has a circuit pattern 102A and contacts 102C. The circuit patterns and contacts are formed by printing using an ink which contains a silver powder. An ink with a carbon powder contained therein may also be printed on the surfaces of the contacts 101C and 102C in order to prevent electromigration of silver atoms. The films 101 and 102 are laid on top of one another with a spacer 103 in which holes are provided at positions corresponding to the contacts 101C and 102C provided therebetween.

Turning to FIG. 2(*a*) which is a cross-sectional view of a pair of contacts 101C and 102C formed on the films 101 and 102, respectively, and the surrounding area, in a state where no external depressing force is applied to the contact 101C, the contacts 101C and 102C are open due to the presence of the spacer 103, Application of a depressing force F to the contact 101 makes the film 101 curved and thereby brings the contact 101C into contact with the contact 102C, as shown in FIG. 2(*b*) . As a result, a current flows between the circuit patterns 101A and 102A, and depression of the key top (not shown) corresponding to the contacts 101C and 102C is detected.

FIG. 3 is a cross-sectional view of a key top 204 and elements which are associated with it. On a support panel 201 made of iron, aluminum or a plastic is disposed the membrane switch 200, which has been described with reference to FIGS. 1 and 2. A housing 202 is disposed on the membrane switch 200 in an opposed relation to the contact of the switch 200, and a slider 203 which moves by depression of the key top 204 is inserted into the housing 202. When the external force applied to the key top 204 is removed, the depressed key top 204 returns to a steady position by springs 205 and 206. Provision of two types of springs 205 and 206 allows the operator to have a desirable "key feel" when he or she depresses the key top.

When the key top 204 is depressed, the contacts (not shown) of the membrane switch 200 are closed by the spring 206, and thus selection of a predetermined key top 204 is detected. Detection requires an encoder or an interface to an external circuit. However, these are not related to the present invention, and description thereof is omitted.

To obtain a comfortable key touch, a stroke of the key top 204 of 3 to 4 mm is desired. Furthermore, to assure smooth movement of the slider 203 which is free from shaking or being caught, the length of the portion of the housing 202 into which the slider 203 is fitted must be 3 to 4 times that of the stroke, preferably 4 times that of the stroke.

FIGS. 4 and 5 are graphs of curves generally employed to represent key touch, i.e., key force profile curves which represent the relation between the depressing force applied to a key top and the displacement of the key top caused by it. The abscissa axis represents key top displacement, and the ordinate axis represents depressing force.

Referring to FIG. 4, as the operator depresses the key top with a finger, the key top begins to sink and a force proportional to the distance which the key top has sunk, i.e., a force proportional to the displacement of the key top, is applied to the finger. When the key top has sunk to a certain position, the force applied to the finger suddenly decreases. That is, the depressing force relative to the displacement decreases at that position. Normally, the contacts of the switch are closed at that position, and the operator senses by the "key feel" of sudden decrease in the force (a click) that key input has been done. When the key top is further depressed, the force proportional to the distance which the key top has sunk is applied again to the finger. When the depressing force is further increased, the key top reaches the position where it cannot be displaced any more. The total displacement to that position is the stroke of the key top. The inclination of the curves shown in FIG. 4 is determined by, for example, the spring constants of the springs 205 and 206 in the structure shown in FIG. 3. To impart a change of decrease in the depressing force, as shown in FIG. 4, a spring 206 may be employed which yields at the depressing force applied immediately before decrease in the depressing force occurs.

FIG. 5 is a graph showing a key force profile curve which exhibits hysteresis. The key force profile curve shown in FIG. 5 is employed more extensively than the curve shown in FIG. 4.

The curve shown in FIG. 5 exhibits step increase and hysteresis characteristics. The step increase in depressing force eliminate shaking of the key top, which would occur at the initial stage of depression, and to prevent displacement of the key top when the depressing force is lower than a fixed value. The hysteresis enables chattering to be suppressed by differing the positions of the key top, corresponding to closing and opening of the switch.

That is, in the depressing process, the contacts of the switch are closed when the key top has been displaced to a position indicated by 'b' on the abscissa axis. In the returning process, the contacts of the switch are opened when the key top has passed the position indicated by 'b' and returned to a position indicated by 'a'. At position 'b' the force applied to the finger suddenly decreases, while at position 'a' the force applied to the finger suddenly increases. Thus, in the depressing process, even when the key top slightly chatters in the vicinity of the position 'b', after it has passed the position 'b', the closed contacts do not open unless the key top returns to the position 'a', and chattering of the contacts can thus be prevented.

Which pattern of the relation between the displacement and the force applied to the finger, i.e., which key touch, among those represented by the key force profile curves is desired depends on an individual operator. Some operators prefer relatively hard key touch (a large spring strength) and other operators like soft key touch (a small spring strength). There are those who feel the "key feel" of sudden change in the depressing force annoying. Thus, when key touch is evaluated, click must be taken into consideration in addition to the stroke of the key top and the magnitude of the force applied to the finger.

However, in a conventional keyboard, the shape of the key force profile curve is determined by, for example, the structure of the slider 203 shown in FIG. 3 and the characteristics of the two springs 205 and 206, and it is thus impossible to adjust key touch according to the liking of an operator. For the operator who does not like the key touch of a given keyboard, there is no remedy but to get used to it. This is very unpleasant, and is undesirable in terms of fatigue and inefficiency which derive from use for a long time.

When design of a keyboard is determined conventionally, a plurality of keyboards having, for example, different strokes and spring strengths are prepared, and the key touch of the product is determined by adding up the results of the evaluations made by a plurality of test operators. Assuming that the test operators preferred spring strengths of 40 grams and 60 grams among the five types of spring strengths from 20 grams to 100 grams which are each different from the previous one by 20 grams, ten types of test keyboards, which are combinations of five types of strokes from 1 mm to 5 mm which are each different from the previous one by 1 mm and two types of spring strengths, 40 grams and 60 grams, are prepared for evaluation. Thus, whereas enormous cost and time are required to manufacture a plurality of types of test keyboards, the results of evaluations made on only several tens of samples are obtained. Furthermore, the key force profile curve representing the relation between the depressing force and the displacement of the key top is determined only by the optimum stroke and spring strength obtained in the manner described above. Thus, evaluations are made only on several key force profile curves whose positions where click occurs differ from each other, i.e., whose hysteresis characteristics differ from each other, and selection is made from only two or three types of keyboards.

SUMMARY OF THE INVENTION

It is an object of the present invention to provide a method of quickly determining the optimum stroke, spring strength and hysteresis characteristics which are required to obtain a key touch desired by a large number of operators.

It is another object of the present invention to provide a device for readily providing key touches represented by desired key force profile curves and for quickly carrying out a test by many operators using such key touches.

To achieve the aforementioned objects, in the present invention, the key force profile curve of depressing force vs. displacement can be changed desirably by detecting a position where the key top changes successively and by generating a force associated with that position by an electromagnetic actuator and applying the force to the key top. Furthermore, desired hysteresis characteristics can be given to the profile curve by changing the set value of the key force profile curve at a predetermined displacement.

DETAILED DESCRIPTION OF THE PREFERRED EMBODIMENT

Figure 6:
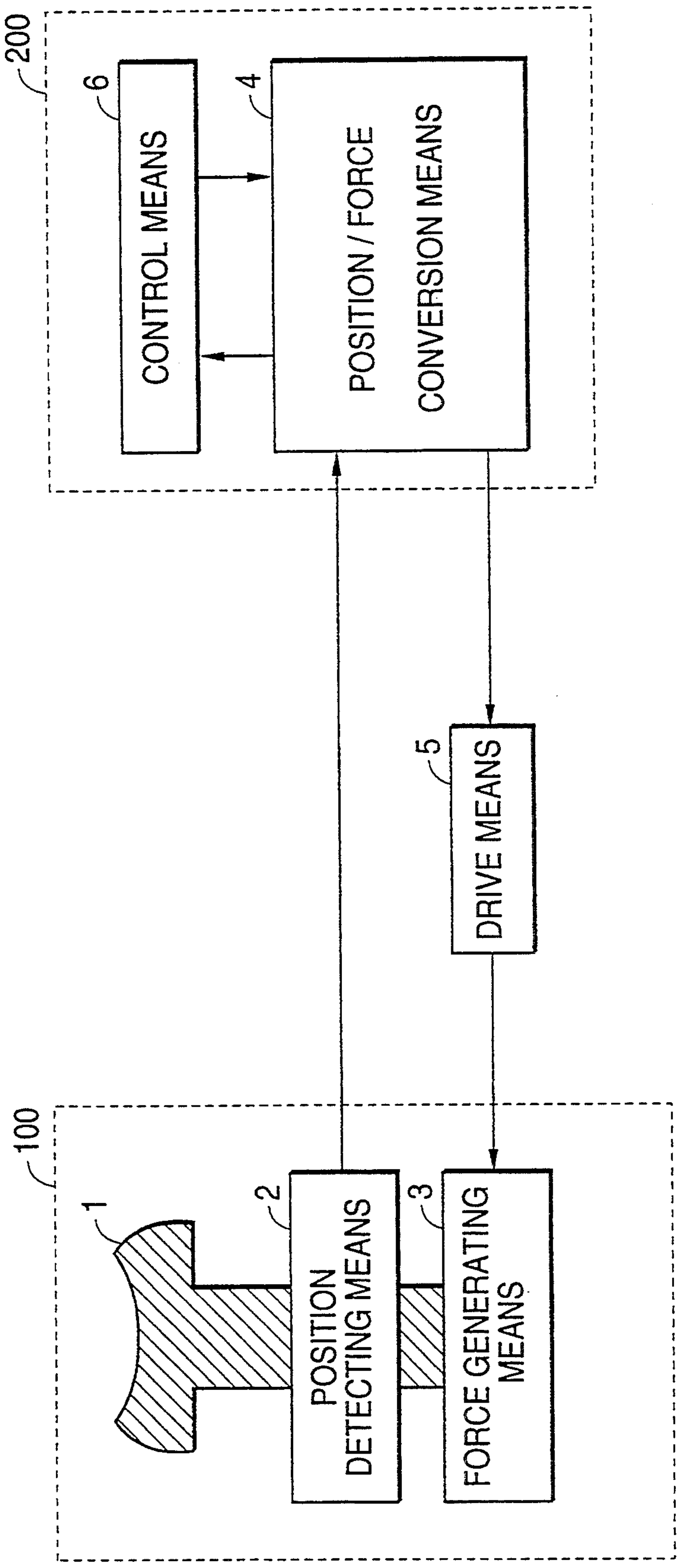
FIG. 6 is a block diagram illustrating the principle of a method according to the present invention and an embodiment of the device.

FIG. 6 is a block diagram illustrating the principle of a key touch adjusting method according to the present invention and an embodiment of a device for carrying out that method.

A key block 100 includes a key top 1 which is displaced when depressed by a finger, position detection means 2 for detecting the position of the key top 1, and force generation means 3 for applying a force to the key top 1 associated with the displacement of the key top 1. Force setting means 200 includes position/force conversion means 4 for converting the positional data detected by the position detection means 2 into force data according to predetermined procedures, and control means 6 for controlling that conversion. Drive means 5 drives the force generation means 3 on the basis of the force data.

Figure 7:
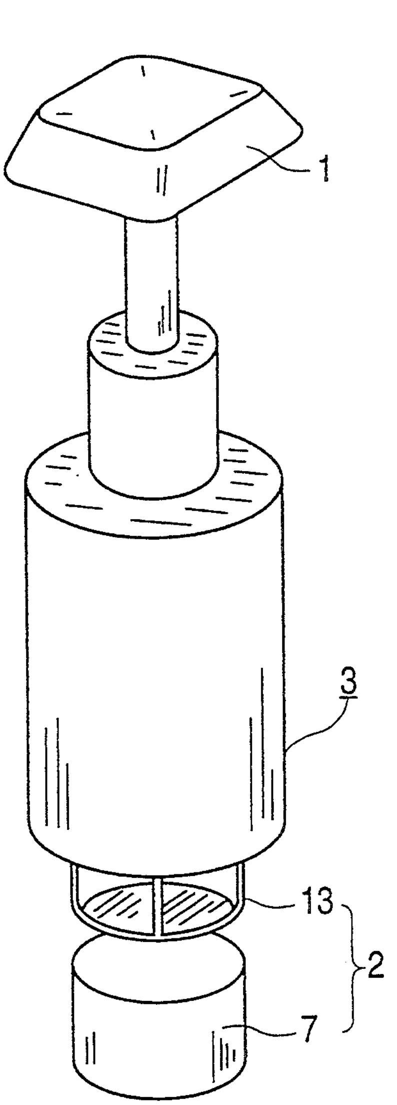
FIG. 7 is a perspective view illustrating an example of the structure of a key block 100 which includes a key top 1, position detection means 2 and force generation means 3.
Figure 8:
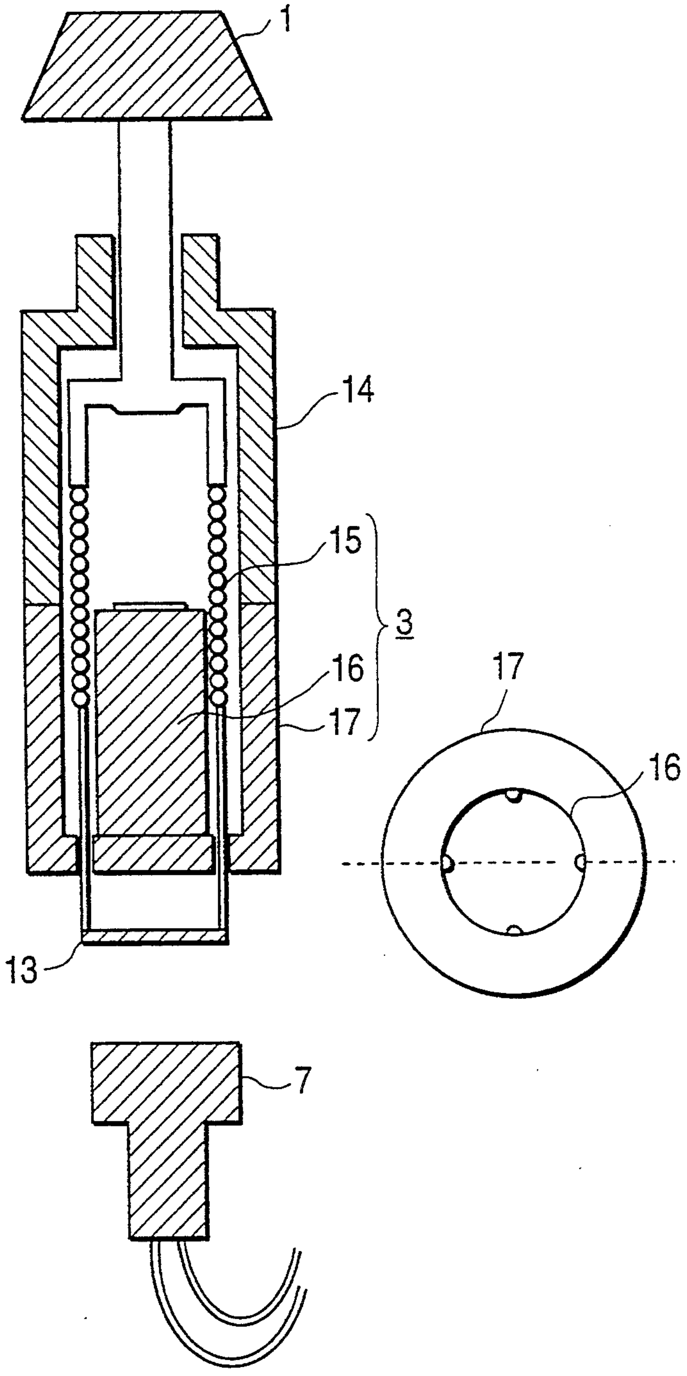
FIG. 8 is a cross-sectional view illustrating the internal structure of the key block 100.

FIG. 7 is a perspective view illustrating the structure of the key block 100 which includes the key top 1, the position detection means 2 and the force generation means 3. FIG. 8 is a cross-sectional view illustrating the internal structure of the key block 100.

Figure 9:
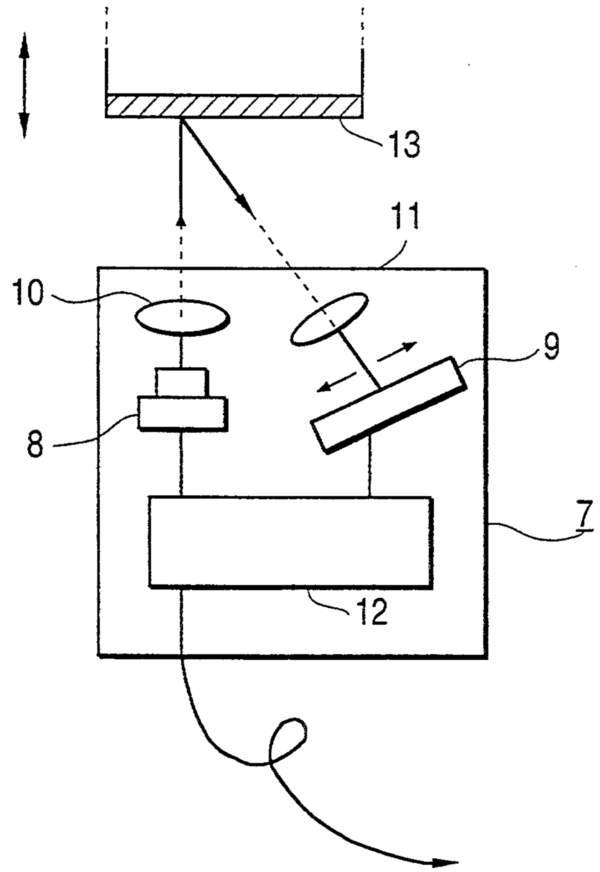
FIG. 9 illustrates the structure of the position detection means 2 which comprises a distance sensor 7.

The position detection means 2 comprises a distance sensor 7 which includes a laser diode 8, a line sensor 9 and a control circuit 12, as shown in FIG. 9. That is, a laser beam emitted from the laser diode 8 is condensed by a lens 10. The condensed light beam is reflected by a target (a reflection mirror) 13 which moves as a result of displacement of the key top 1. The reflected light beam is condensed by a lens 11, and is then made incident on the line sensor 9. Since the distance sensor 7 is spatially fixed, as the target 13 moves and the distance between the target 13 and the distance sensor 7 thereby changes, the position on the line sensor 9 where the reflected light is incident changes. The line sensor 9 outputs, for example, a voltage signal corresponding to the incident position. It is therefore possible to detect the position of the key top 1 or a change in the position thereof by that voltage signal.

The force generation means 3 comprises, for example, an electromagnetic actuator including a coil 15, a permanent magnet 16 and a magnetic yoke 17. The coil 15 is connected to a shaft coupled to the key top 1. The permanent magnet 16 and the yoke 17 are coupled to a spatially fixed casing 14 in a state wherein they are coupled to each other. Thus, as the key top 1 is depressed, the coil 15 moves in a space between the permanent magnet 16 and the yoke 17. When a current flows in the coil 15, a force corresponding to the current and the magnitude of the magnetic field is generated in the coil 15 according to the Fleming's left-hand rule. More specifically, when a current I flows in an electric wire having a length L and disposed perpendicular to a magnetic field H generated between the permanent magnet 16 and the yoke 17, a force F expressed by $F=\mu H\times L\times I$ is generated in a direction perpendicular to the magnetic field and current. $\mu$ is the permeability which is $4\pi\times10^{-7}$ in a vacuum.

Practically speaking, if current I=0.5 ampere is supplied to the coil 15 having magnetic field H of 2500 oersted ($2500\times1000/4\pi$AT/m), an average diameter of 14.5 mm and 400 turns, a force expressed by $$\begin{aligned} F &= 4\pi\times10^{-7}\times(2500\times1000/4\pi)\times14.5\pi\times \\ &\quad 10^{-3}\times400\times0.5 \\ &= 2.278\ N = 232.4\ \text{gram-weight} \end{aligned}$$

Since the depressing force actually applied to the keys of a keyboard is 200 gram-weight at most, an electromagnetic actuator which is available on the market can be used as the force generation means 3 to obtain a force required to achieve the objects of the present invention.

The position detection means 2 is not limited to the optical sensor such as that shown in FIG. 9 and a capacity sensor for detecting changes in the electrical capacity caused by the displacement of the key top 1, a semiconductor strain sensor for detecting changes in the strain caused by the displacement of the key top 1, a sensor for detecting changes in a magnetic field caused by the displacement of the key top by a Hall element or a sensor for detecting changes in a magnetic field as an eddy current may also be employed.

The force generation means 3 is not limited to the electromagnetic actuator such as that shown in FIG. 8, and a piezo actuator whose length changes according to an applied voltage or an electro-static actuator which utilizes attraction and repulsion of positive and negative electric charges may also be used.

Japanese Patent Laid-Open No. Sho 62-217516 discloses a key touch of a button switch testing device for testing which device automatically measures the depressing force applied to a key top and the displacement of the key top caused by the application of the depressing force and then automatically compares the thus obtained key force profile with a preset reference profile to determine whether the depressed switch is normal or not. However, although this device is capable of evaluating the characteristics of the button switch, it cannot be applied to adjust key touch according to the key operation by the operator.

Figure 10:
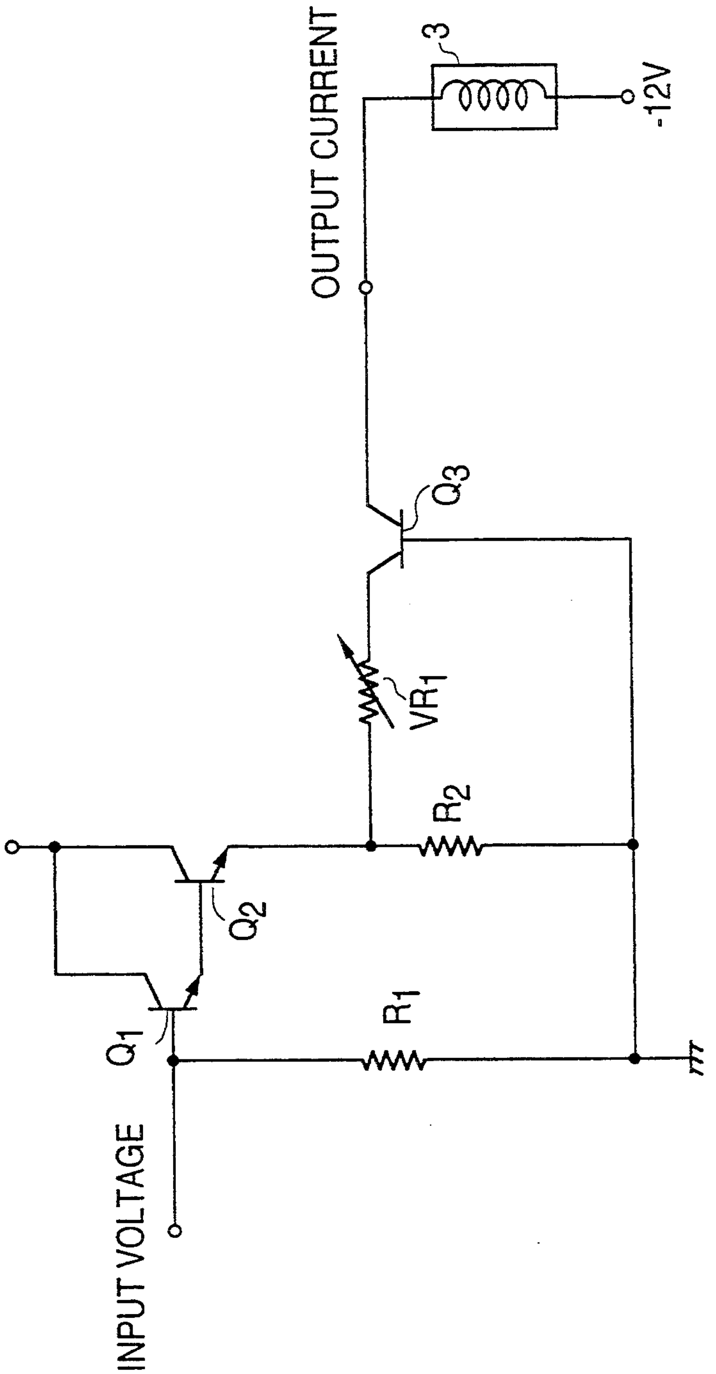
FIG. 10 is a circuit diagram illustrating an example of a driving means 5 for driving the force generation means 3 which is an electromagnetic actuator.

FIG. 10 is a circuit diagram illustrating an example of the drive means 5 for driving the force generation means 3 which comprises the electromagnetic actuator shown in FIG. 8. An input stage includes transistors $Q_1$ and $Q_2$ which are Darlington connected to each other to enhance current gain. A transistor $Q_3$ is a common base structure connected from the emitter follower transistor $Q_2$, and is an output stage for causing a current to flow in the coil 15 of the force generation means 3. Since the transistor $Q_3$ has the common base structure which ensures a high output impedance, it can operate as a constant current source.

Figure 1:
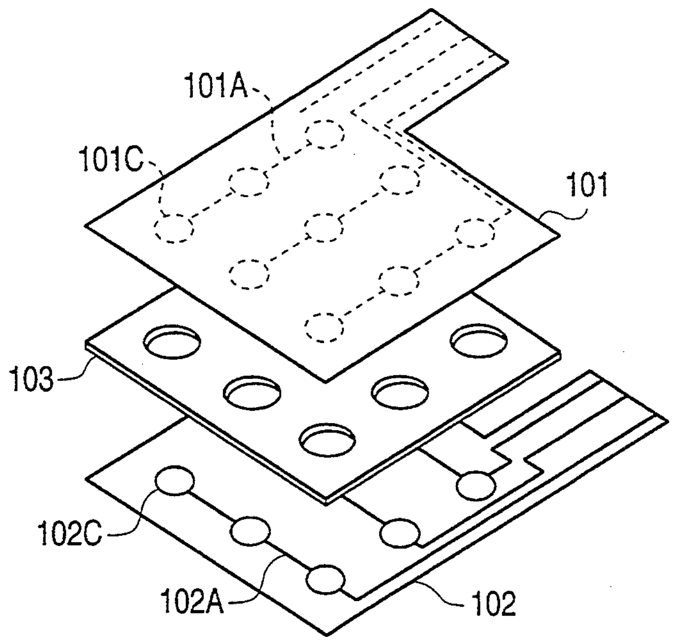
FIG. 1 PRIOR ART
FIG. 1 is a perspective view illustrating an example of the structure of a membrane switch.
Figure 3:
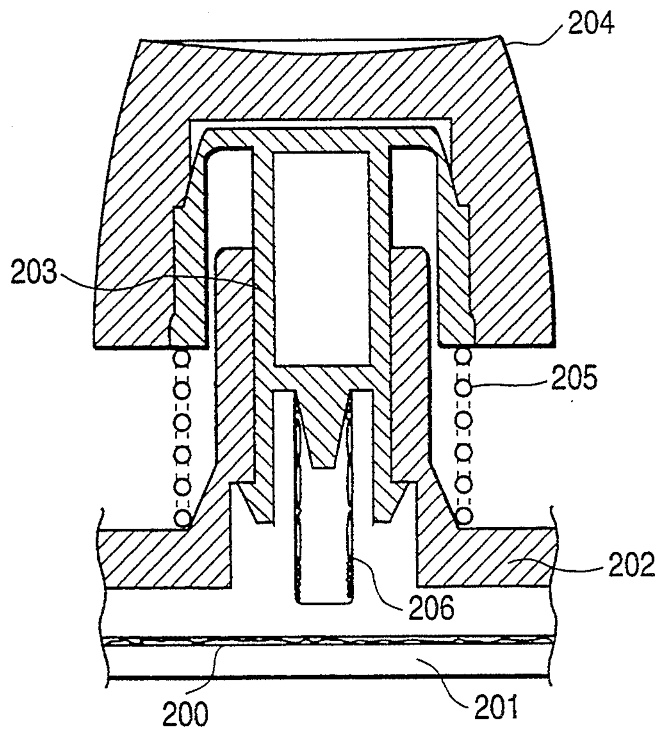
FIG. 3 PRIOR ART
FIG. 3 is a cross-sectional view illustrating the structure of a key top and elements associated with the key top.
Figure 2A:
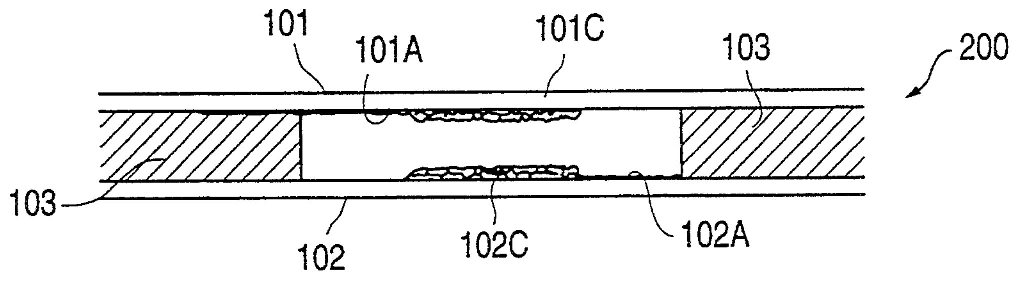
FIG. 2(a) PRIOR ART
FIGS. 2(*a*) and 2(*b*) are schematic sectional views illustrating the structure of an electric contact in FIG. 1.
Figure 2B:
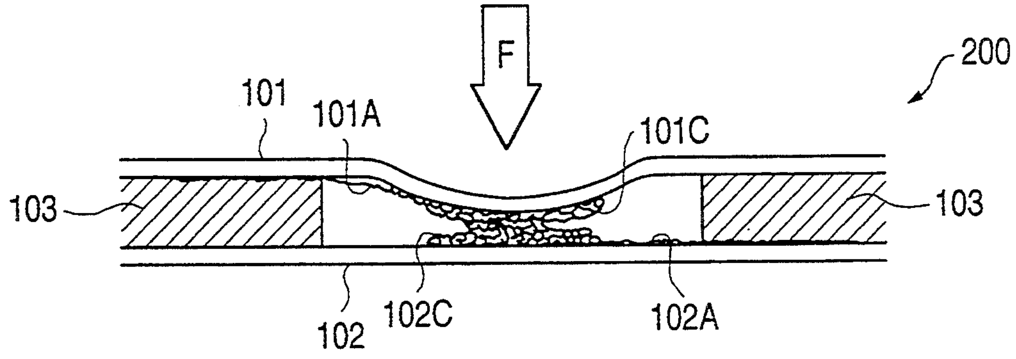
FIG. 2(b) PRIOR ART
Figure 4:
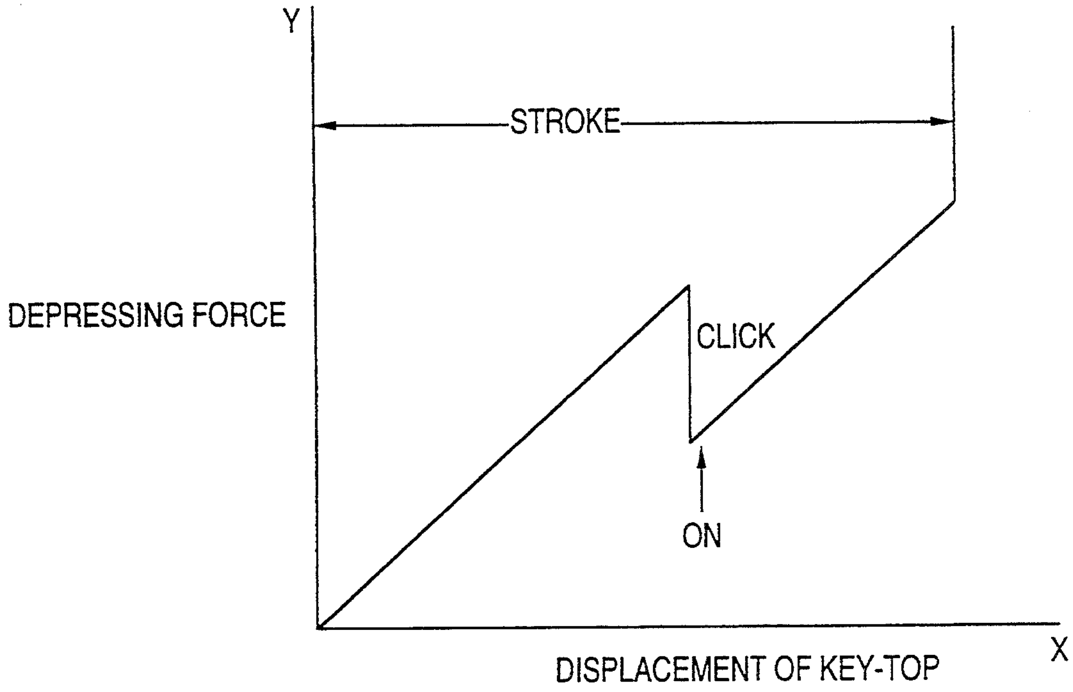
FIG. 4 PRIOR ART
FIGS. 4 and 5 are graphs of a profile curve representing the relation between the depressing force applied to the key top and the displacement of the key top caused by the depressing force.
Figure 5:
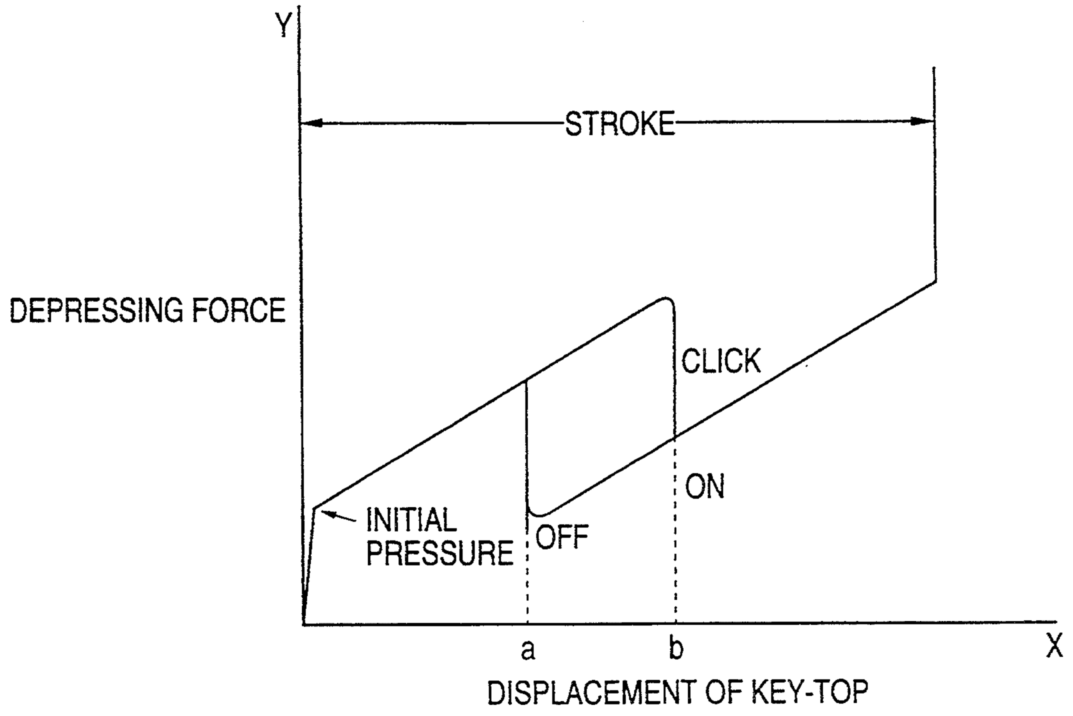
FIG. 5 PRIOR ART

The circuit shown in FIG. 10 receives a control signal voltage of 0 to 5 v from the position/force conversion means 4 and converts it into a current of 0 to 500 mA to drive the coil 15 of the force generation means 3. Reference character $VR_1$ denotes a variable resistor for adjusting the ratio of the output current to the input voltage, i.e., the gain. Thus, the gradient of the key force profile curve shown in FIG. 4 or 5 can be varied by adjusting $VR_1$.

Japanese Patent Laid-Open No. Hei 2-177223 discloses a mechanism for changing the force required to turn on the switch of a keyboard by utilizing electromagnetic force. However, in this mechanism, the electromagnetic force remains the same at least in the single period of the key operation, and the resistive force does not change according to the displacement of the key top, unlike the present invention.

Figure 11:
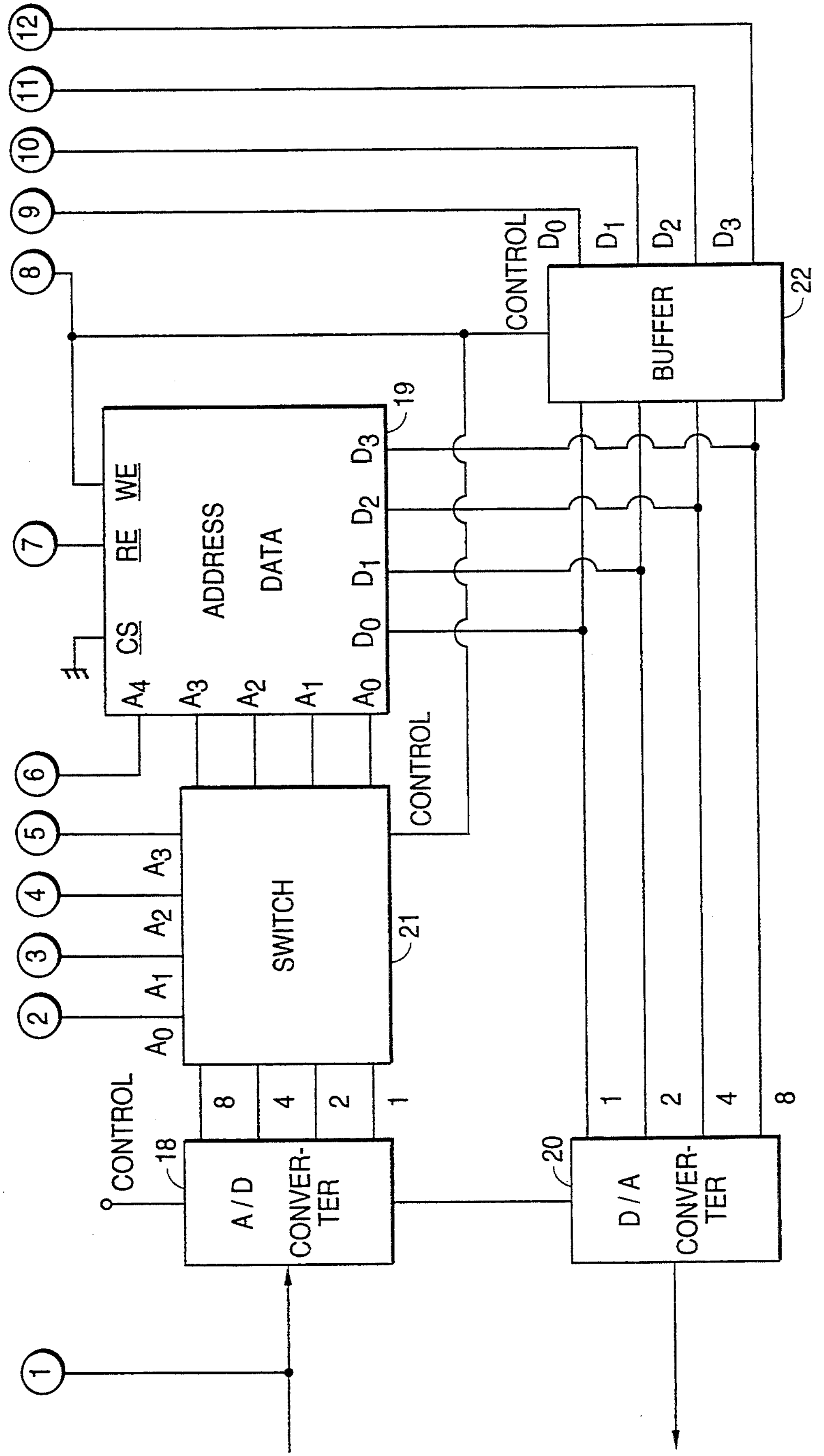
FIG. 11 is a circuit diagram illustrating an example of position-force conversion means 4 in force setting means 200 shown in FIG. 6.

FIG. 11 is a circuit diagram illustrating an example of the position/force conversion means 4 in the force setting means 200. The position/force conversion means 4 includes an analog/digital (A/D) converter 18 for converting the position signal voltage sent from the position detection means 2 into digital data, a memory 19 for storing the position data as well as the force data corresponding to the position data, and a digital/analog (D/A) converter 20 for converting the force data read out from the memory 19 into an analog signal. Reference numerals 21 and 22 denote means for writing the force data in the memory 19. The switch 21 is used to change the path with which the address of the memory 19 is set, and the buffer 22 is made active when the force data are written into the memory 19. A control line connected to the A/D converter 18 and the D/A converter 20 is used to set an initial state or to input a clock.

Figure 12:
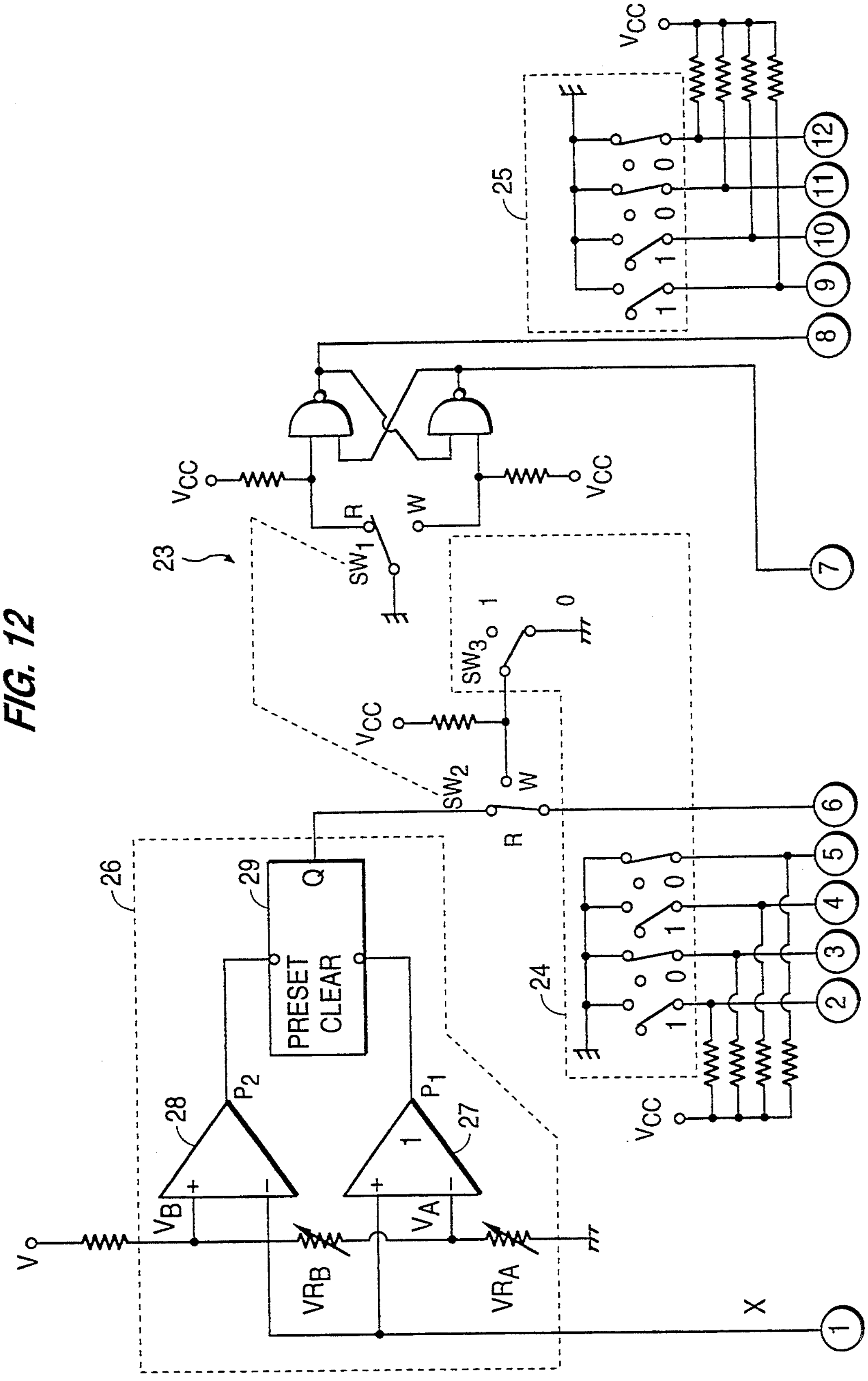
FIG. 12 is a circuit diagram illustrating an example of control means 6 in the force setting means 200 shown in FIG. 6.

FIG. 12 is a circuit diagram illustrating an example of the control means 6 in the force setting means 200 shown in FIG. 6. The control means 6 includes a change-over control block 23 for changing over the operation mode between the mode in which the force data is read out from the memory 19 and the mode in which the force data is written in the memory 19, an address setting block 24 for setting the address of the force data to be written, and a hysteresis setting block 26 for applying hysteresis characteristics to the key force profile.

The change-over control block 23 includes bipolar switches $SW_1$ and $SW_2$ coupled to each other, and a flip-flop having two NAND gates. The address setting block 24 and the data setting block 25 each have a switch group consisting of four switches for outputting a logical 0 or 1 value independent of each other. The outputs of these switch groups are connected to the corresponding inputs of the switch 21 and those of the buffer 22, shown in FIG. 11, respectively.

The hysteresis setting block 26 includes two comparators 27 and 28 and a set/reset flip-flop 29. Position data represented by an analog voltage is input from the position detection means 2 to both the positive input of the comparator 27 and the negative input of the comparator 28. In order to adjust the reference voltages, variable resistances $VR_A$ and $VR_B$ are connected to the other inputs of the comparators 27 and 28, respectively.

The operation of the force setting means 200 including the position/force conversion means 4 and the control means 6 will be described below. In FIGS. 11 and 12, an A/D converter 18 and a D/A converter 20 each having a 4-bit structure and a memory 19 having a capacity of 4 bits/word, i.e., 32 words (128 bits), are used, respectively. However, this is not essential to the present invention, and an A/D converter 18 and a D/A converter 20 of, for example, 8 bits or above and a memory 19 having a capacity of 256 bits or above may be employed. The major electronic devices employed in the circuits shown in FIGS. 11 and 12 are those which are available on the market. For example, integrated circuits ADS70 and AD557 (both are manufactured by Analog Devices Inc.) may be used as the A/D converter 18 and the D/A converter 20, respectively. An integrated circuit MB84256J (manufactured by Fujitsu Ltd.) may be used as the memory 19. Integrated circuits 74157 and 74244 (both are manufactured by Texas Instruments Inc.) may be used as the switch 21 and the buffer 22, respectively.

Referring first to FIG. 11, when a position signal voltage is input from the position detection means 2 to the A/D converter 18, it is converted into 4-bit digital position data. The output of A/D converter 18 passes through the switch 21 and is then input to address lines $A_0$ to $A_3$ of the memory 19. If the signal to be input to the fifth address line $A_4$ of the memory 19 has a logical 0 value, the digital position data output from the A/D converter 18 is used as an address signal without change. If the output data of the A/D converter 18 is, for example, 0, the data, i.e., the force data, written at address 0 in the memory 19 is read out. If the output data of the A/D converter 18 is 1, the force data written at address 1 in the memory 19 is read out. Similarly, if the output data of the A/D converter 18 is 15, the force data at address 15 in the memory 19 is read out. The force data which is read out from the memory 19 is input to the D/A converter 20 via data lines $D_O$ to $D_3$.

If the signal input to the address line A4 of the memory 19 has a logical 1 value, the force data written at address 16 and the subsequent addresses in the memory 19 is read out. That is, if the output data of the A/D converter 18 is 0, the force data written at address 16 in the memory 19 is read out. If the output data of the A/D converter 18 is 1, the force data at address 17 in the memory 19 is read out. Similarly, if the output data of the A/D converter 18 is 15, the force data at address 31 in the memory 19 is read out. The read output data is input to the D/A converter 20 via the data lines $D_0$ to $D_3$.

The force data input to the D/A converter 20 in the manner described above is converted into an analog signal, and is then sent out to the drive means 5. The function of the address line $A_4$ of the memory 19 will be described later in detail.

To write desired force data at a desired address in the memory 19, the change-over control block 23, the address setting block 24 and the data setting block 25, as shown in FIG. 12, are provided. The address setting block 24 and the data setting block 25 each have the four switches that can be changed over between a logical 0 or 1 value independent of each other. It is assumed that 0101, i.e., address 5, is set in the address setting block 24 and then 0011, i.e., 3, is set in the data setting block 25, as shown in FIG. 12. It is also assumed that the switch SW3 is changed over to the logical 0 value.

When the switches $SW_1$ and $SW_2$ are changed over to the writing (W) side, both the control terminals of the switch 21 and buffer 22 and a $\overline{WE}$ terminal of the memory 19 fall to the logical low level while a $\overline{RE}$ terminal of the memory 19 rises to the logical high level. Consequently, the memory 19 is switched over to the writing mode, the switch 21 is changed over to the address setting block 24 side, and the buffer 22 is changed over such that it outputs a signal from the data setting block 25. Thus, the force data 3 set by the data setting block 25 is written in the memory 19 at the address 5 designated by the address setting block 24. When the switches $SW_1$ and $SW_2$ are changed over to the reading out (R) side, the memory 19 returns to the reading out mode. When the force data is written at addresses 16 to 31, the switch $SW_3$ is changed over to the logical 1 value.

Figure 13:
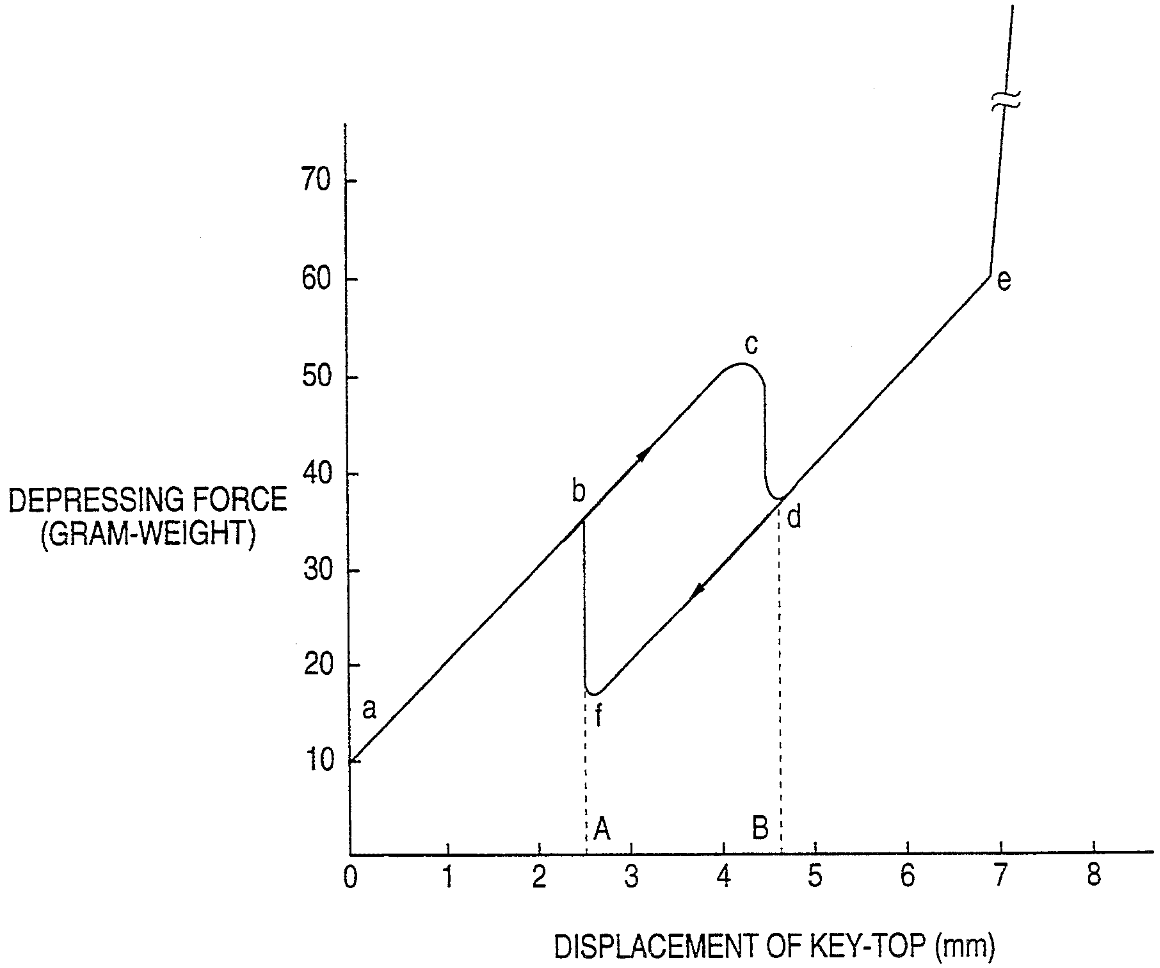
FIG. 13 illustrates an example of a key force profile curve to be achieved in the present invention.

FIG. 13 illustrates an example of the key force profile curve which is no be achieved by the present invention. In the profile curve shown in FIG. 13, the depressing force has a hysteresis relative to the displacement of the key top, that is, two force values exist relative to the same displacement. To provide such a hysteresis, the hysteresis setting block 26 shown in FIG. 12 is provided. The hysteresis setting block 26 includes two comparators 27 and 28, a set/reset (RS) flip-flop 29 and two variable resistors $VR_A$ and $VR_B$. The comparators 27 and 28 are obtained by using products which are available on the market. For example, LM311 (manufactured by National Semiconductor Corp.) and 7474 (manufactured by Texas Instruments Inc. ) can be used as the comparators 27 and 28 and the flip-flop 29, respectively.

$VR_A$ is adjusted such that the negative input of the comparator 27 is set at a level equal to the position signal voltage $V_A$ corresponding to the displacement A shown in FIG. 13, and $VR_B$ is adjusted such that the positive input of the comparator 28 is set at a level equal to the position signal voltage $V_B$ corresponding to the displacement B shown in FIG. 13. That is, the reference voltages of the comparators 27 and 28 are $V_A$ and $V_B$ (where $V_A<V_B$), respectively. As the key top is depressed, the position signal voltage X output from the position detection means 2 gradually increases. This voltage is compared with the reference voltages VA and $V_B$ by the comparators 27 and 28.

If $X<V_A$, an output $P_1$ of the comparator 27 is at a low level, and since X is as $X<V_B$, an output $P_2$ of the comparator 28 is at a logical high level. Thus, the RS flip-flop 29 is cleared, and an output Q thereof thereby falls to a logical low level. When X further increases and $VA<X<V_B$, the output $P_1$ of the comparator 27 turns to the logical high level. However, the output $P_2$ of the comparator 28 remains the same, so the output Q of the flip-flop 29 is maintained to a logical low level. When X further increases and $VB<X$, the output $P_2$ of the comparator 28 falls to a logical low level, raising the output Q of the RS flip-flop 29 to a logical high level. Thereafter, even when the key top is depressed further and X thereby further increases, the state of the output Q remains the same.

The process in which the key top returns to its original position when the depressing force is weakened will be described below. First, when the key top rises, the position signal voltage X thereby lowers and $X<V_B$, although the output $P_2$ of the comparator 28 rises to a logical high level, the output Q of the RS flip-flop remains at a logical high level. When the key top further rises and $X<V_A$, the output $P_1$ of the comparator 27 falls to a logical low level, and the output Q of the RS flip-flop thereby falls to a logical low level again.

In the depression process, the output Q of the RS flip-flop remains at a logical low level until the key top is displaced to position B. In the returning process, the output Q of the flip-flop 29 remains at a logical high level until the key top passes position B and returns to position A.

During the operation of the key top, since the memory 19 is generally in the reading out mode, the output of the RS flip-flop 29 is connected to address line $A_4$ of the memory 19. Thus, until the key top is displaced to position B, i.e., when the position signal voltage $X<V_B$, address line $A_4$ remains at a logical low level, and the force data at addresses 0 to 15 in the memory 19 is thus read out. In the process in which the key top returns to position A after it has passed position B, address $A_4$ remains at a logical high level until position signal voltage $X<V_A$, and the force data at addresses 16 to 31 in the memory 19 is read out. Thus, predetermined hysteresis characteristics can be achieved by storing the force data corresponding to the portion of the curve shown in FIG. 13 which is indicated by a →b→c→d at addresses 0 to 15 and the force data corresponding to the portion of the curve which is indicated by d→e→d→f→b at addresses 16 to 31.

Figure 14:
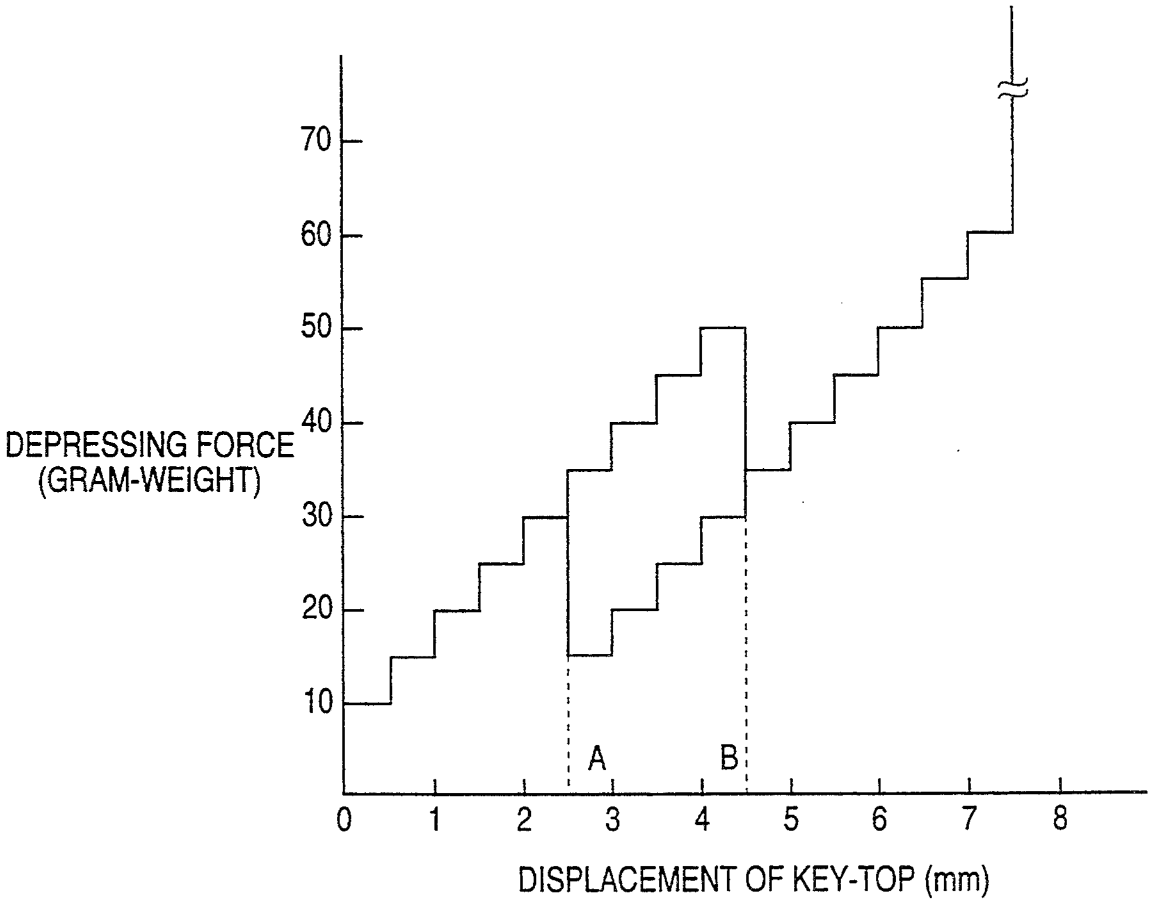
FIG. 14 illustrates an example of a key force profile curve achieved by the present invention.

FIG. 14 is a graph of a practically employed key force profile curve which is obtained in the manner described above. Although the profile curve shown in FIG. 14 is stepwise because the 4-bit A/D converter 18 and the 4-bit D/A converter 20 are employed in the structures shown in FIGS. 11 and 12 and the resolution for the position detection and force control is thereby 1/16 of the maximum displacement of the key top, it achieves substantially the same characteristics as the curve shown in FIG. 13. A smoother key force profile curve can be obtained by using a 8-bit A/D converter 18, a 8-bit D/A converter 20 and a memory 19 having a capacity corresponding to the bit structure of the A/D converter 18 and D/A converter 20. Furthermore, although the addresses in the memory 19 are assigned from 0 to 31 in the aforementioned structure, they can be assigned desired numbers. Furthermore, the number of force data corresponding to the position data of the key top is not limited to one set but a plurality of sets may be stored in the memory 19. Such plurality of sets are changed over when necessary. In that case, upper address lines $A_5$ to $A_N$ are used. Furthermore, the structure of the address setting block 24 and data setting block 25 is not limited to that shown in FIG. 12 which employs the switching elements but a structure employing registers or memories and to which an address and data are transferred from an external circuit via an interface, such as RS-232C, may also be adopted.

Figure 15:
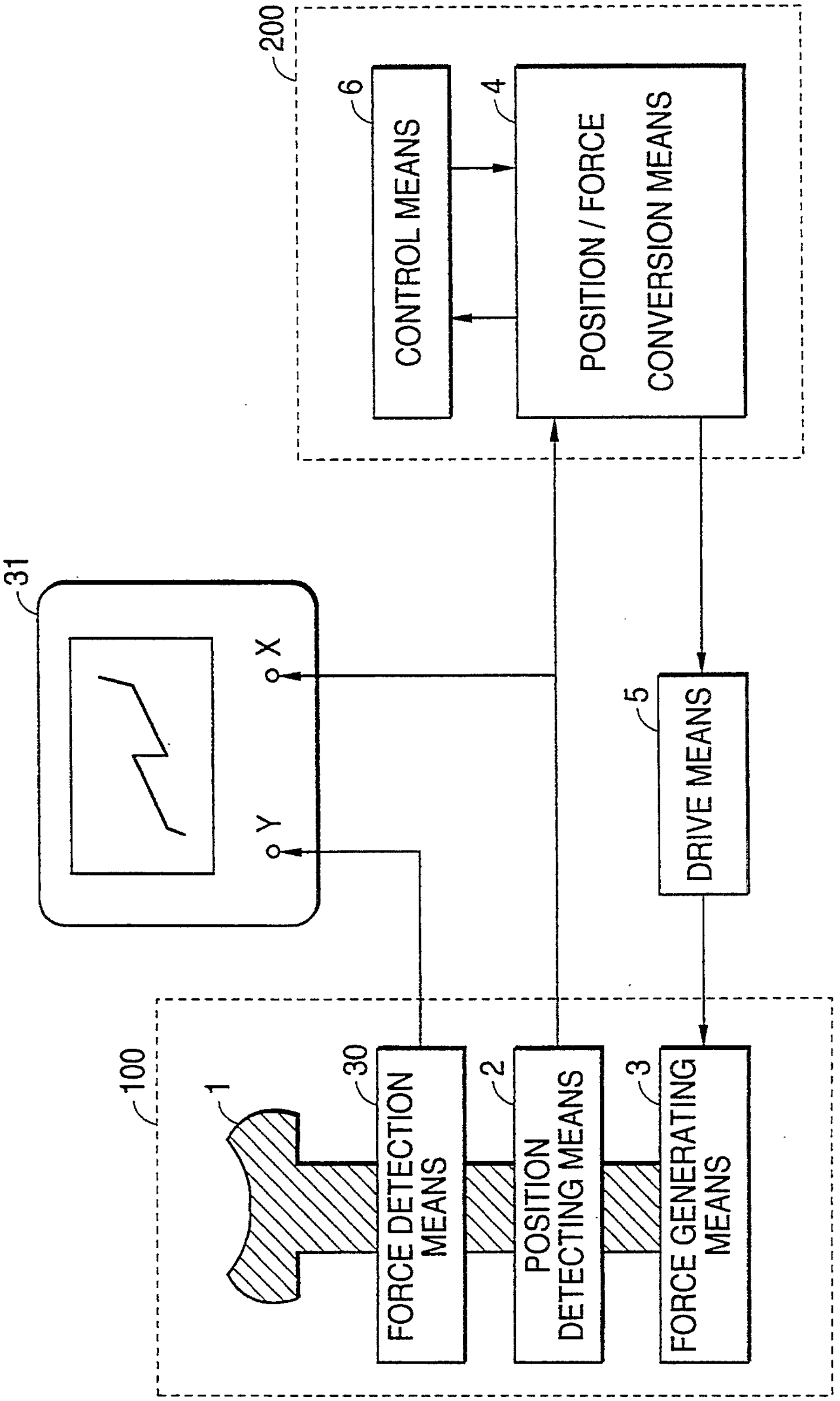
FIG. 15 is a block diagram illustrating a second embodiment of the key touch adjusting device according to the present invention.

FIG. 15 is a diagrammatic view of a second embodiment of the key touch adjusting device according to the present invention. Identical reference numerals in FIG. 15 to those in FIGS. 1 through 14 represent similar or identical elements.

In the second embodiment, depressing force detection means 30 for measuring the depressing force applied to the key top 1 is added to the key block 100, and display means 31 for displaying the key force profile curve is provided. A known resistance wire strain gauge or a semiconductor strain gauge, such as the ultra-miniature pressure sensor PSL-500GA manufactured by KYOWA Electronic Instruments Co., may be employed as the depressing force detection means 30.

Figure 16:
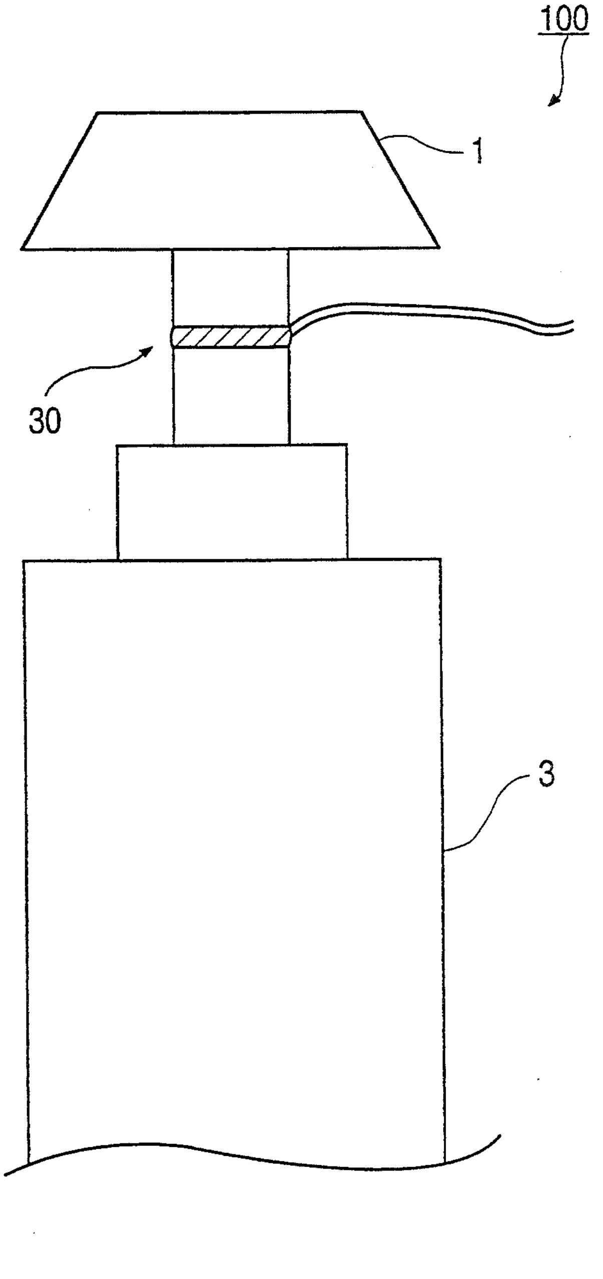
FIG. 16 is a schematic partially enlarged view of the key block 100 to which depressing force detection means 30 in FIG. 15 is added.

FIG. 16 is a schematic partially enlarged view of the key block 100 to which the depressing force detection means 30 is added. The depressing force detection means 30 is provided between the key top 1 and the force generation means 3. Practically, the depressing force detection means 30 is buried in the shaft of the key top 1. The depressing force detection means 30 is arranged such that it outputs a voltage corresponding to the depressing force applied to the key top 1. The display means 31 has, for example, an X-axis input terminal and a Y-axis input terminal so that the position signal voltage output from the position detection means 2 can be input to the X-axis input terminal while the force signal voltage output from the depressing force detection means 30 can be input to the Y-axis input terminal. Consequently, in the display means 31, the displacement generated by depression of the key top 1 is displayed on the abscissa axis, while the corresponding depressing force is displayed on the ordinate axis. The site where the depressing force detection means 30 is disposed is not limited to that shown in FIG. 16 but the depressing force detection means 30 may also be provided at the upper portion of the key top 1, immediately below the key top 1 or inside the force generation means 3.

Figure 17:
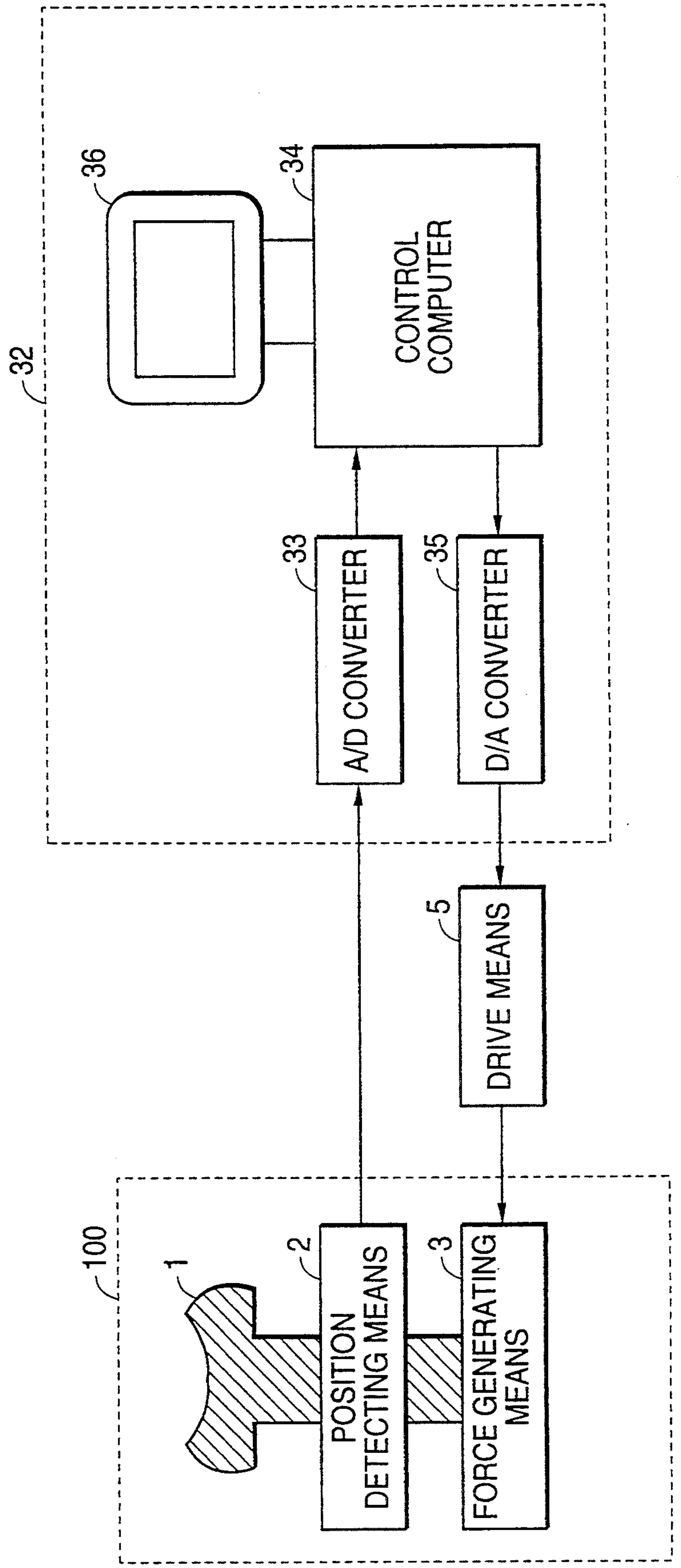
FIG. 17 is a block diagram illustrating a third embodiment of the key touch adjusting device according to the present invention.

FIG. 17 is a diagrammatic view of a third embodiment of the key touch adjusting device according to the present invention. Identical reference numerals in FIG. 17 to those in FIGS. 1 through 16 represent similar or identical elements.

Figure 18:
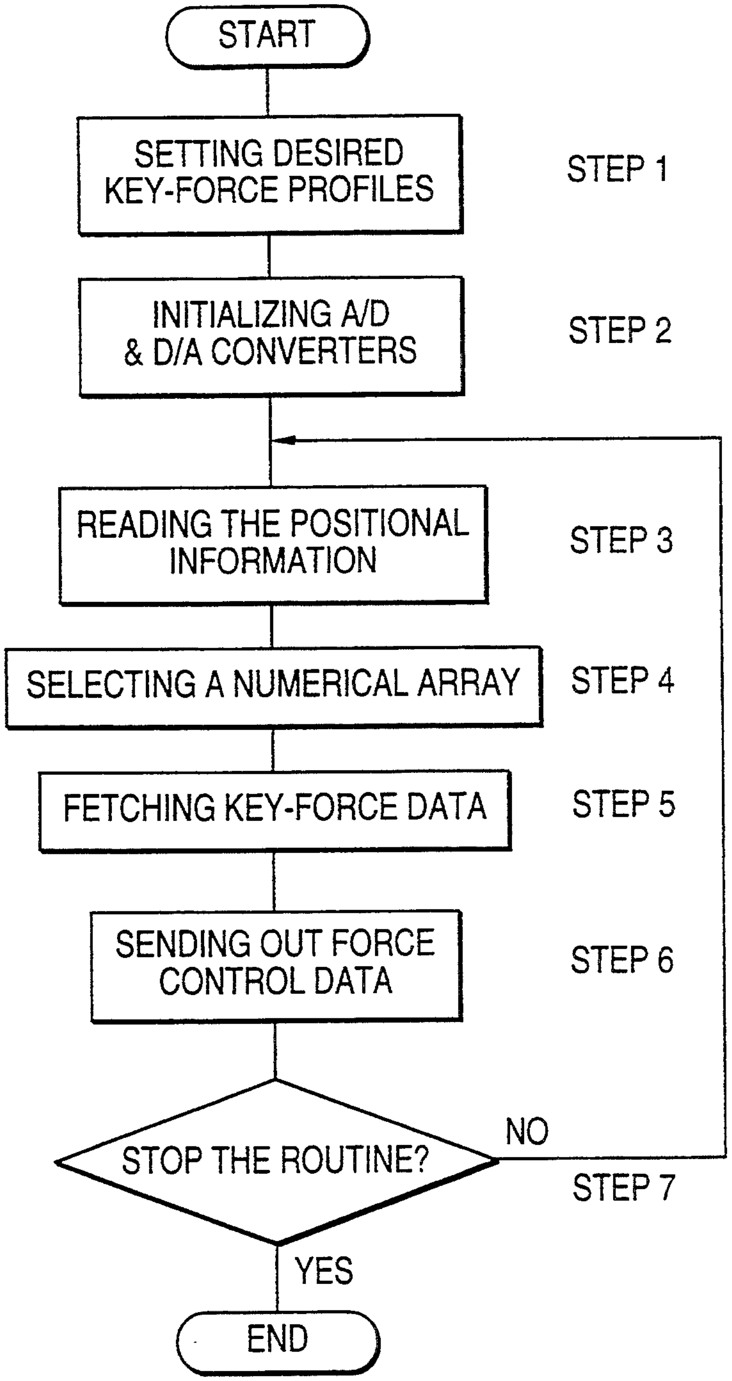
FIG. 18 is a flowchart illustrating the procedures of a control computer 34 shown in FIG. 17

In the third embodiment, both the major portion of the position/force conversion means 4 and that of the control means 6 in the force setting means 200 are replaced by a data processing unit 32. That is, the data processing unit 32 includes an A/D converter 33, a control computer 34, a D/A converter 35, and a console display 36. For example, FMR-70HX (manufactured by Fujitsu Ltd.) or a board computer or a single-chip computer having the similar function may be employed as the control computer 34. The basic process performed by the control computer 34 includes (1) setting of desired key force profile curves, (2) initialization of the A/D converter 33 and the D/A converter 35, (3) reading in of the position data of the key top, (4) selection of a numeral array in which the position data and the force data corresponding to the position data are stored, (5) fetching of the force data corresponding to the position data, (6) output of the force data, and (7) determination of ending condition. These procedures will be described below with reference to FIG. 18.

Step 1: The operator writes a desired key-force profile in the memory of the control computer 34 as a numeral array. When some numeral arrays are prepared beforehand, a numeral array corresponding to the desired key force profile is selected, whereby the numeral array closest to the desired key force profile curve is selected from among the numeral arrays in which various force data corresponding to the positions of the key top 1 are stored. If a key-force profile exhibiting the hysteresis characteristics is desired, two numeral arrays are generally used.

Step 2: The A/D converter 33 and the D/A converter 35 are initialized, whereby the data processing unit 32 is made operable.

Step 3: The position data from the position detection means 2 is converted into digital data by the A/D converter 33 and is then read into the control computer 34.

Step 4: One of the numeral arrays selected in step 1 is selected according to the position data which is read in.

Step 5: The force data corresponding to the position data which is read in is fetched from the numeral array selected in step 4, and force data on which correction has been made by a predetermined coefficient or constant is prepared.

Step 6: The force data is output to the D/A converter 35, whereby an analog control voltage is input to the drive means 5.

Step 7: It is determined whether or not a stop command has been input from the input unit of the control computer 34. If the stop condition is not satisfied, the control computer 34 reads in another position data to repeat the process from step 3 to step 7.

In this embodiment, since the force data corresponding to the position data of the key top is defined as the numeral array, a plurality of numeral arrays can be prepared within the range of the capacity of the memory in the control computer 34 or in an external storage device. Thus, if a large number of numeral arrays for position data vs force data are initially defined, a desired key force profile curve can be obtained by selecting the optimum numeral array when necessary. As a result, the operation of the key touch adjusting device according to the present invention does not necessitate setting of data by the address setting block 24 and data setting block 25 to be performed, as in the case of the first embodiment described with reference to FIG. 12 and a quick and accurate operation can be performed.

A key-force profile curve may be displayed on the console display 36 which is attached to the control computer 34. This facilitates calibration required to make the set value of the force coincide with an actual force value. That is, adjustment of gain of the drive means 5 by $VR_1$, as in the case of the first embodiment, is replaced by storing of correction coefficients or constants obtained on the basis of the results of the measurements of the force value generated by the force generation means 3 in the memory of the control computer 34. Furthermore, the provision of the special means for setting the hysteresis characteristics is not necessary. That is, whereas in the first embodiment, the hysteresis characteristics are set by adjusting $VR_A$ and $VR_B$ in the hysteresis setting block 26, the hysteresis characteristics are provided by changing the numeral arrays according to the position data, in this embodiment.

Figure 19:
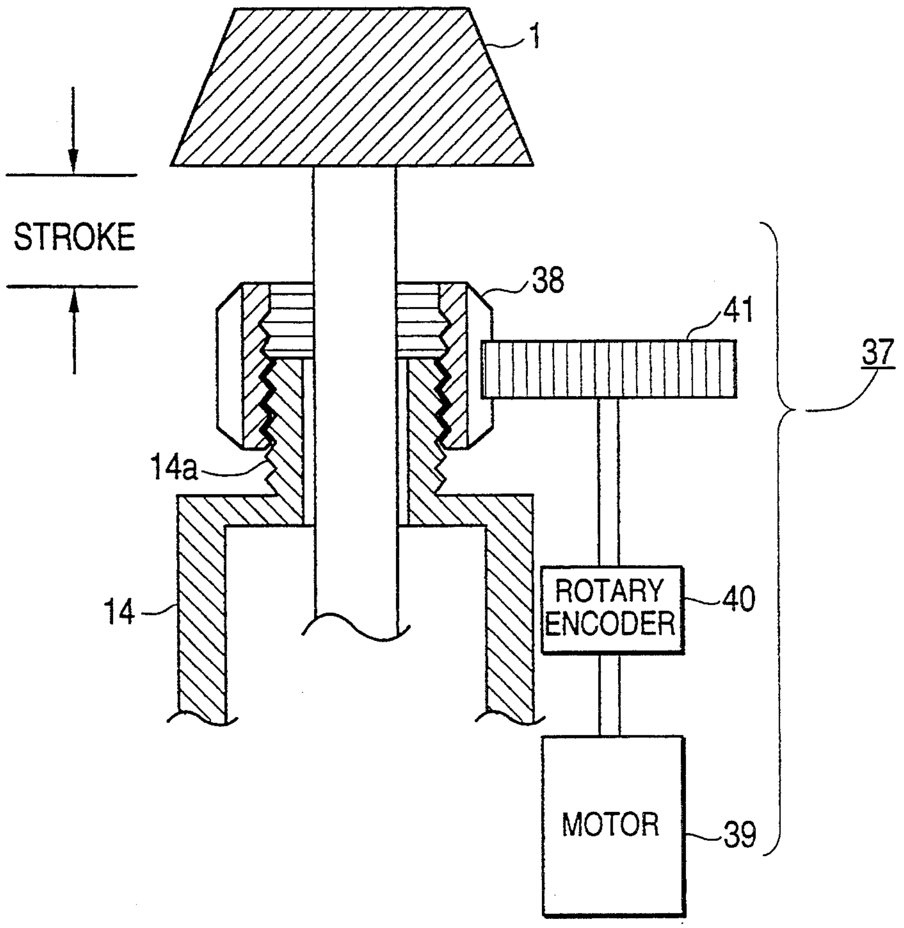
FIG. 19 is a schematic cross-sectional view illustrating a fourth embodiment of the key touch adjusting device according to the present invention.

FIG. 19 is a schematic cross-sectional view illustrating a fourth embodiment of the present invention. FIG. 19 illustrates a mechanism for adjusting the stroke of the key top 1, i.e., the range in which the key top 1 is displaced. Identical reference numerals in FIG. 19 to those in FIGS. 1 through 18 represent similar or identical elements.

A mechanism 37 added in this embodiment includes a stopper 38 for restricting the displacement range of the key top 1, a motor 39 serving as means for adjusting the position of the stopper 38, a rotary encoder 40 serving as means for detecting the position of the stopper 38, and a gear 41 for transferring the rotation of the motor 39 to the stopper 38.

The stopper 38 is a cylindrical member whose outer surface is knurled and whose inner surface is internally threaded so that it can be threadedly engaged with an externally threaded side surface of a top portion 14*a* of the casing 14 shown in FIG. 19. The gear 41 is in mesh with the outer surface of the stopper 38. Thus, when the gear 41 is rotated by the motor 39 through the rotary encoder 40, the stopper 38 moves along a shaft coupled to the key top 1 while rotating. Consequently, the distance between the key top 1 and the stopper 38 changes, i.e., the stroke of the key top 1 is adjusted. The rotary encoder 40 is arranged such that it counts the number of pulses generated in proportion to the rotational angle of the output shaft of the motor 39. Thus, the position of the stopper 38 is determined on the basis of the number of pulses which have been counted by the time the stopper 38 has moved from its reference position to a certain position by the motor 39 which the stroke of the key top 1 is adjusted.

In the first to third embodiments, the range in which the key top 1 can be displaced is determined by the force generation means 3. That is, in the graph shown in FIG. 14, when the key top 1 is displaced by 7.5 mm, the force generation means 3 generates a resistance of, for example, 200 gram-weight so as to make the operator feel with the finger that the key has been displaced over the entire stroke. In a normal key touch adjustment operation, that method is enough to achieve the object. However, if excess depressing force is applied within the range in which the force generation means 3 can be mechanically operated, the key top may be further displaced. As a result, even if it is desired to test the key touch at a short stroke, e.g., at a stroke of, for example, 2 mm, a stroke larger than 2 mm may be actually obtained. The key touch obtained at that time is unstable. Such a problem can be solved by using a force generation means 3 capable of generating a resistance of several kilogram-weight at a maximum. However, the use of such a force generation means 3 is impossible in terms of dimensions or power consumption.

In this embodiment, since the displacement of the key top is mechanically restricted by the stopper 38, even if a short stroke is set, the operator can experience the same key touch as that obtained with keys in a normal keyboard.

Figure 20:
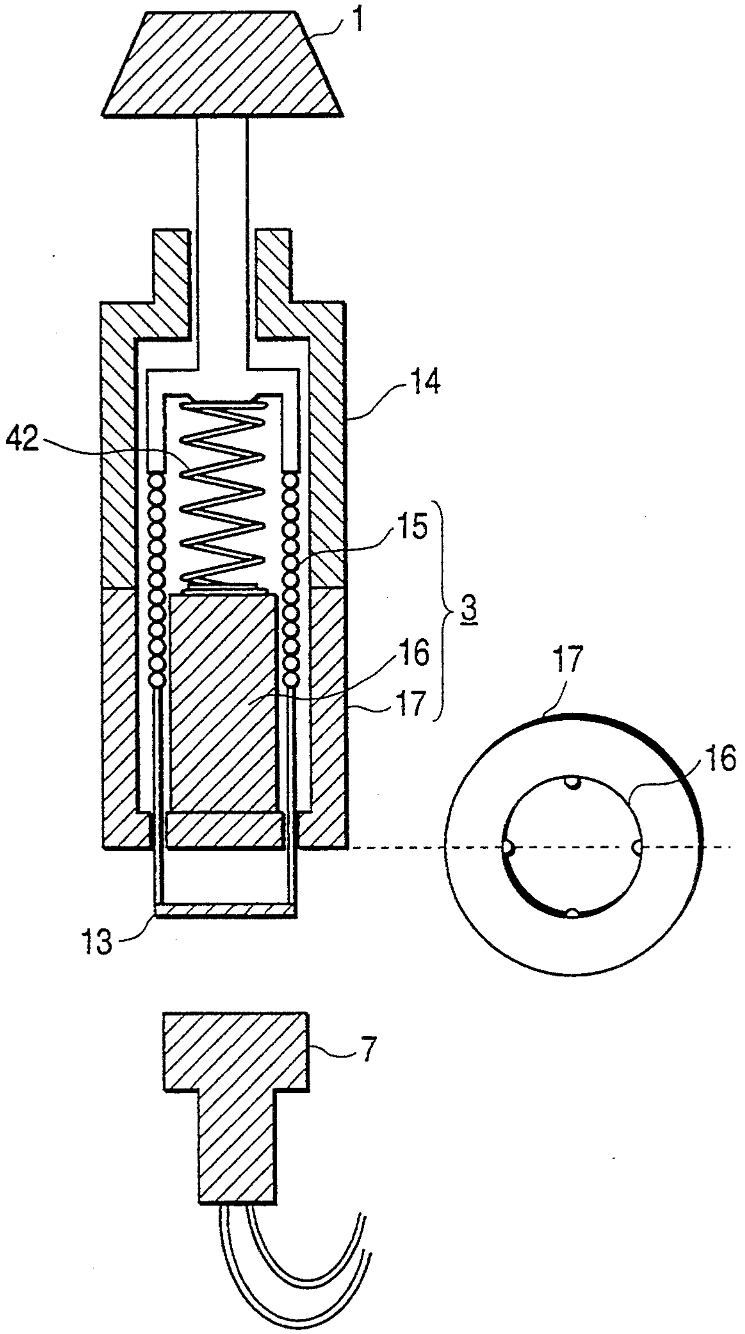
FIG. 20 is a schematic cross-sectional view illustrating a fifth embodiment of the present invention.

FIG. 20 is a schematic cross-sectional view of a modification of the force generation means 3, illustrating a fifth embodiment of the present invention. Identical reference numerals in FIG. 20 as those in FIGS. 1 through 19 represent similar or identical elements.

More specifically, the force generation means 3 of this embodiment includes an electromagnetic actuator such as that shown in FIG. 8 and a spring 42, as shown in FIG. 20. The spring 42 has a spring constant which allows the spring 42 to support the weight of the movable portion including the key top 1, e.g., the coil 15 which is the component of the electromagnetic actuator, and the target 13 of the distance. sensor 7 for detecting the displacement of the key top 1. In the force generation means 3 shown in FIG. 8, the weight of the movable portion, such as the key top 1 and so forth is supported by the force generated by the electromagnetic actuator. Since the total weight of the movable portions ranges between several grams and several tens of grams, the electromagnetic actuator must always be generating the force that can support this weight. Hence, a current of about 100 mA must be supplied constantly to the electromagnetic actuator. This current sometimes corresponds to about 1/5 of the maximum current, and uneconomically increases the power consumption.

In this embodiment, since the weight of the movable portion is supported by the spring 42, it is not necessary to supply a current to the electromagnetic actuator constantly, and the power consumption can thus be reduced. It may also be arranged such that the spring 42 generates a force including the initial pressure shown in FIGS. 5 and 13.

Figure 21:
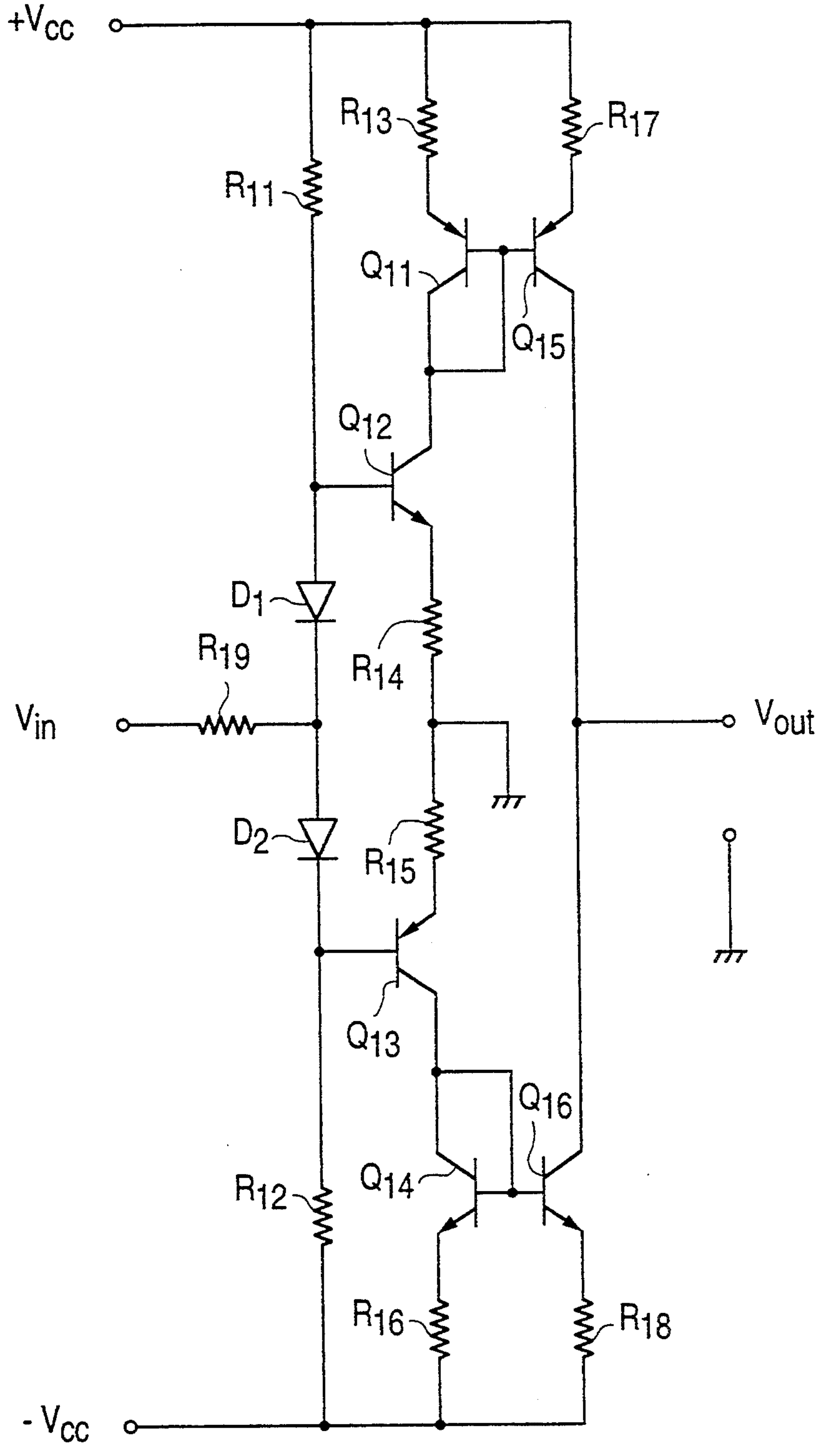
FIG. 21 is a circuit diagram illustrating an example of the driving means 5 used to carry out the fifth embodiment.

In a case where the spring 42 is provided, in order to change the initial pressure or change the magnitude of the resistive force proportional to the displacement of the key top, the electromagnetic actuator must be designed such that it generates the force not only in the direction opposite to that of the depressing force but also in the same direction as that of the depressing force. FIG. 21 is a circuit diagram of an example of the drive means 5 which makes the electromagnetic actuator generate the force in two directions. The drive means 5 includes resistors $R_{11}$ to $R_{19}$, diodes $D_1$ and $D_2$ and, a complementary push-pull emitter follower and a complementary current mirror circuit consisting of transistors $Q_{11}$ to $Q_{16}$. When the polarity of an input voltage $V_{in}$ is positive, the upper half of the circuit is activated when the polarity of the input voltage $V_{in}$ is negative, the lower half of the circuit is activated. Consequently, the direction of the current which follows in the coil 15 connected to an output $V_{out}$ is reversed, thus changing the direction of the force applied to the key top 1 by the force generation means 3. Voltages having positive and negative polarities may also be input to the drive means 5 by applying an offset of a negative voltage to the output of the D/A converter 20 shown in FIG. 11 or by employing a D/A converter 20 which outputs positive and negative voltages with 0 v as the center.

Figure 22:
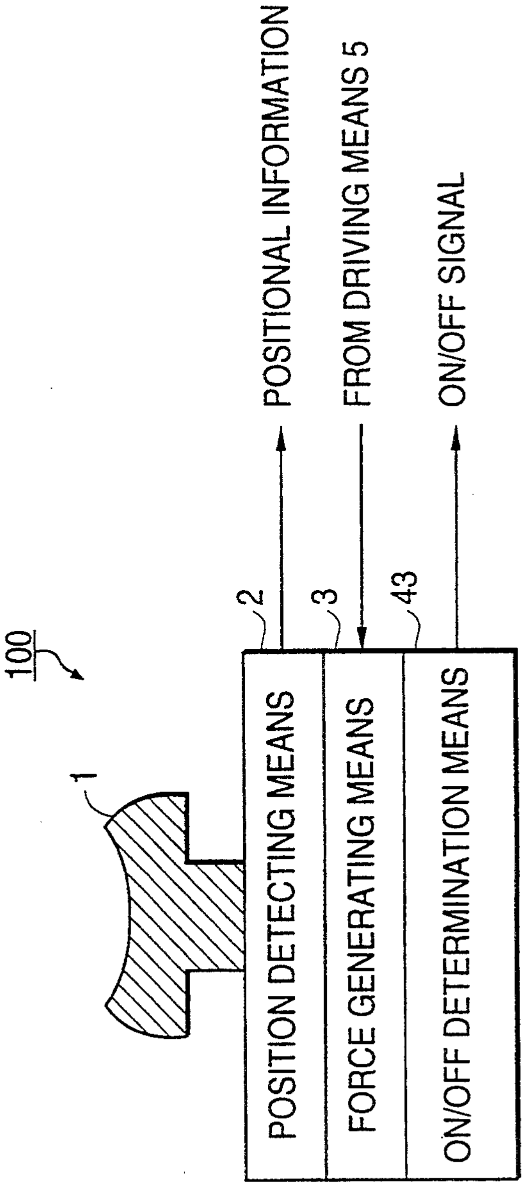
FIG. 22 is a block diagram illustrating a component of a sixth embodiment of the present invention.

FIG. 22 is a block diagram illustrating a sixth embodiment of the present invention. Identical reference numerals in FIG. 22 to those in FIGS. 1 through 21 represent similar or identical elements.

In this embodiment, the key block 100 includes a switch as an on/off determination means 43 which is activated synchronously with the key top 1. A normally employed mechanical switch or the membrane switch shown in FIGS. 1 and 2 can be used as the switch. An on/off signal sent out from the switch by the depression of the key top 1 is detected so as to allow the key touch adjusting device of this embodiment to be utilized in the same manner as that of the keys of a normal keyboard.

Figure 23:
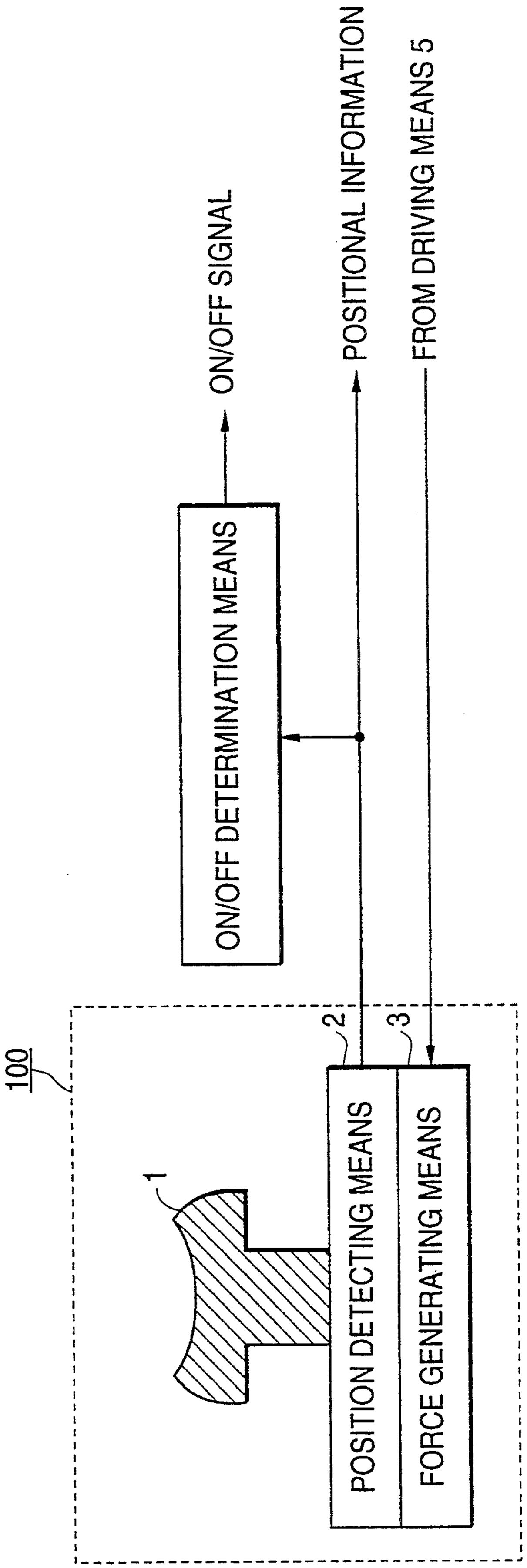
FIG. 23 is a block diagram illustrating a component of a seventh embodiment of the present invention.

FIG. 23 is a block diagram of a seventh embodiment of the present invention. Identical reference numerals in FIG. 23 to those in FIGS. 1 through 22 represent similar or identical elements.

Figure 24:
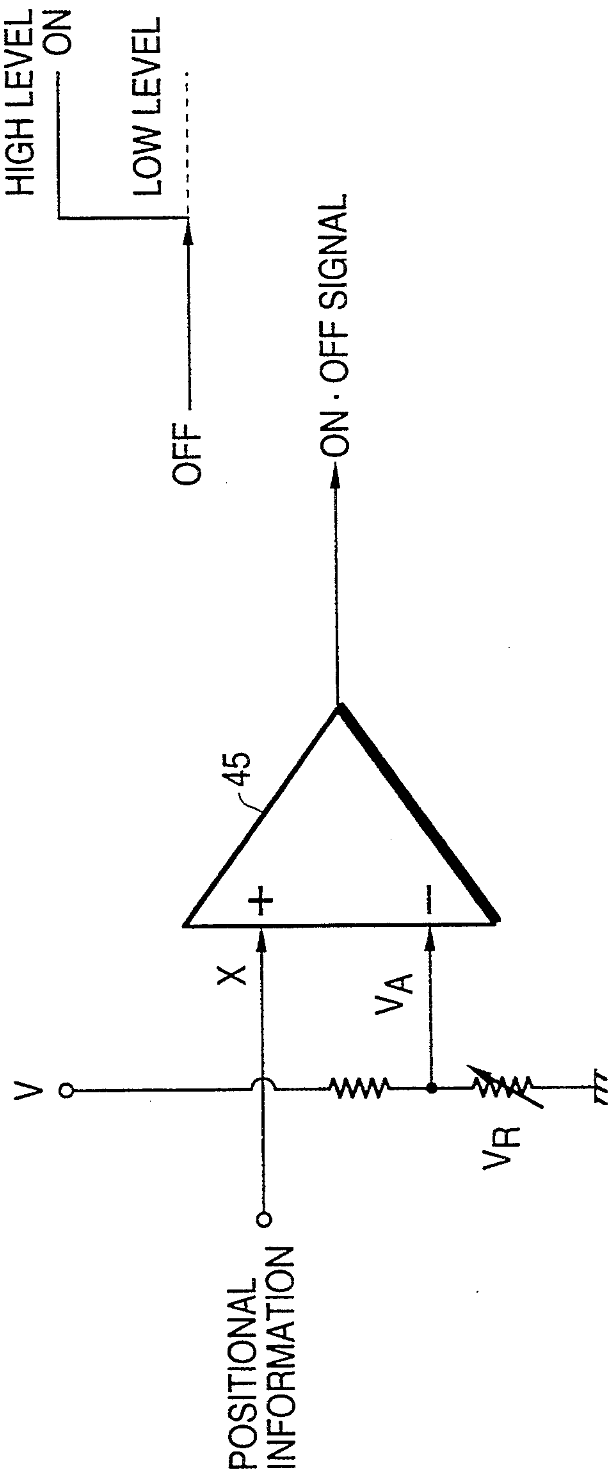
FIG. 24 is a circuit diagram illustrating an example of on/off determination means used to carry out the seventh embodiment of the present invention.

In this embodiment, on/off determination is made by utilizing the positional data detected by the position detection means 2. That is, the on/off determination means 43 outputs an on/off signal on the basis of the position data input from the position detection means 2, the electric contacts required in the sixth embodiment is not necessary in this embodiment. FIG. 24 illustrates an example of such an on/off determination means 43. The on/off determination means 43 includes an analog comparator 45 which receives a positional signal voltage X from the position detection means 2 at a positive input thereof and a reference voltage $V_A$ equal to the positional signal voltage corresponding to the position of the key top 1 where the on/off signal is generated at a negative input thereof.

As the key top 1 is depressed, the positional signal voltage X increases. When $X<V_A$, the output of the analog comparator 45 remains at a logical low level corresponding to an off signal. When the key top 1 is further depressed and $X<V_A$, the output of the analog comparator 45 rises to a logical high level corresponding to an on signal. In the key top returning process, when $X<V_A$, the output of the analog comparator 45 falls to a logical low level again, i.e., an off signal is sent out from the analog comparator 45.

Figure 25:
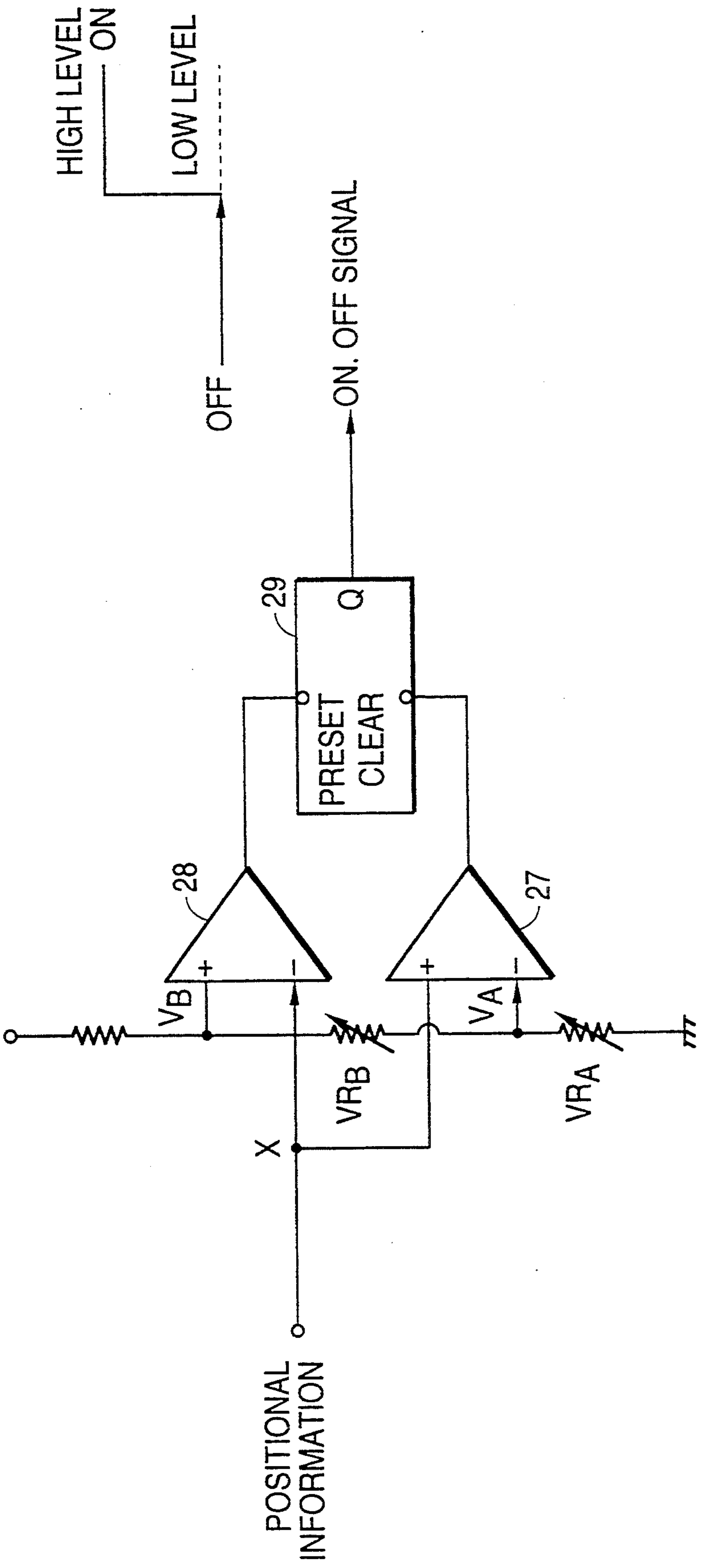
FIG. 25 is a circuit diagram illustrating another example of the on/off determination means used to carry out the seventh embodiment of the present invention.

In the on/off determination circuit shown in FIG. 24, in the vicinity of $X=V_A$, a change between the logical low and high levels is sudden. In other words, chattering phenomenon occurs in which on and off states mingle with each other due to fine variations in the depressing force. FIG. 25 illustrates an example of on/off determination means 43 having hysteresis characteristics in order to avoid the phenomenon. The structure of the circuit shown in FIG. 25 is the same as that of the hysteresis setting block 26 shown in FIG. 12, and detailed description of the operation thereof is omitted. In FIG. 25, X is the position signal voltage, $V_A$ is the lower reference voltage, and $V_B$ is the higher reference voltage. In the process in which X which is smaller than $V_A$ increases, when $X>V_B$, the output of the RS flip-flip 29 rises to the logical high level. In the process in which X decreases, the output of the RS flip-flop 29 which is at the logical high level falls to the logical low level when $X<V_A$. Thus, the outputs of the RS flip-flop 29, i.e., the position of the key top 1 where the on/off signal is changed over from off to on and the position of the key top 1 where the on/off signal is changed over from on to off, differ from each other, and chattering is thus prevented.

Figure 26:
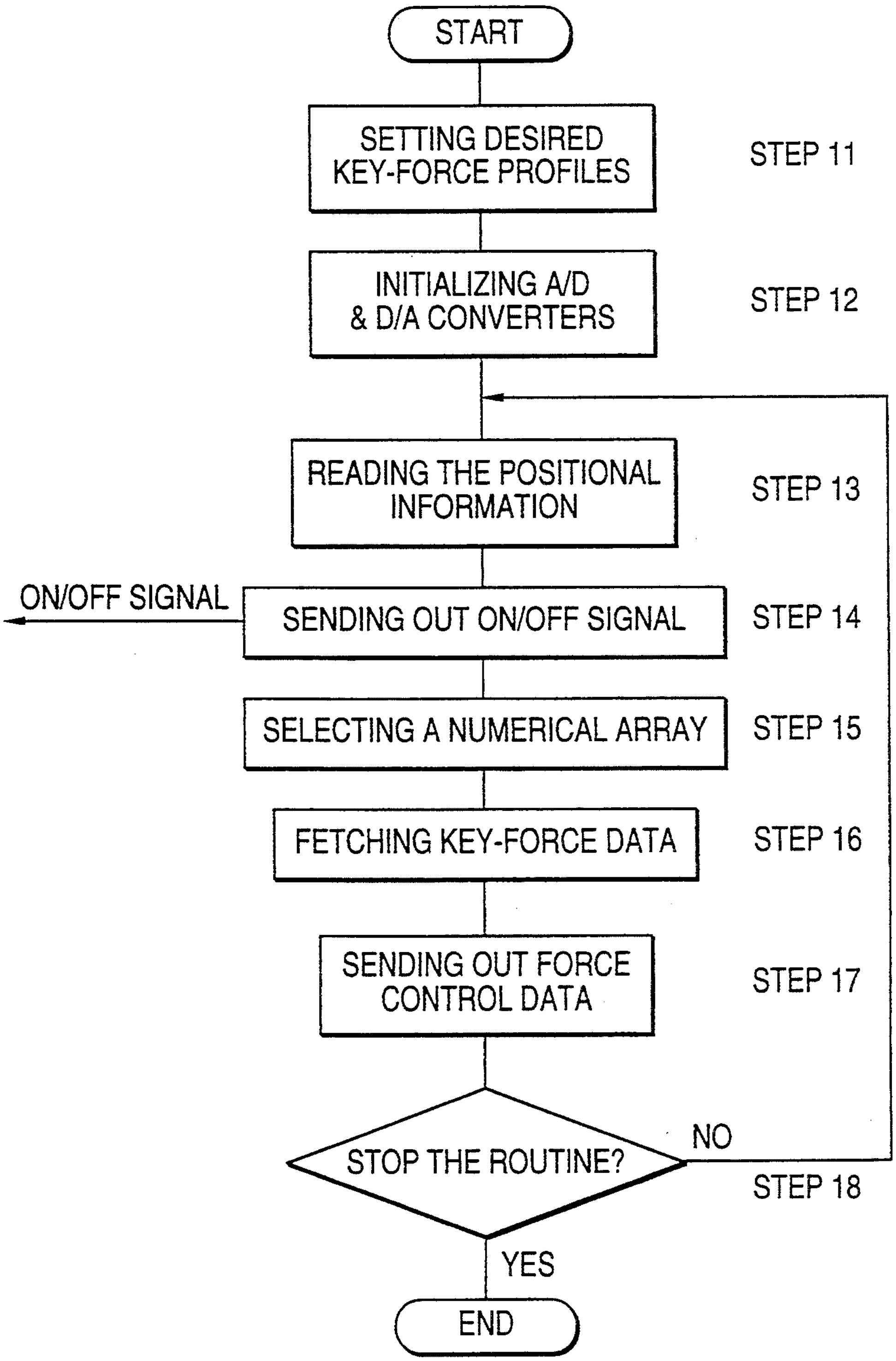
FIG. 26 is a flowchart illustrating the procedures when the on/off determination means shown in FIG. 25 is applied to the key touch adjusting device shown in FIG. 17.

The operation of a structure in which the on/off determination means 43 of the seventh embodiment is applied to the key touch adjusting device of FIG. 17 will be described below with reference to FIG. 26.

Step 11: The operator selects desired key force profiles, whereby a numeral array closest to the desired key force profile curve is selected from among the numeral arrays in which various force data corresponding to the positions of the key top 1 are stored.

Step 12: The A/D converter 33 and the D/A converter 35 are initialized, whereby the data processing unit 32 is made operable.

Step 13: The position data from the position detection means 2 is converted into digital data by the A/D converter 33 and is then read into the control computer 34. The position data from the position detection means 2, i.e., the position signal voltage, is input to the on/off determination means 43 also.

Step 14: On/off determination means 43 performs on/off determination on the basis of the position signal voltage.

Step 15: One of the numeral arrays selected in step 11 is selected according to the position data which is read in.

Step 16: The force data corresponding to the position data which is read in is fetched from the numeral array selected in step 15, and force data on which correction is made by a predetermined coefficient or constant is prepared.

Step 17: The force data is output to the D/A converter 35, whereby an analog control voltage is input to the drive means 5.

Step 18: It is determined whether or not a stop command has been input from the input unit of the control computer 34. If the stop condition is not satisfied, the control computer 34 reads in another position data to repeat the process from step 13 to step 18.

In the on/off determination means 43 shown in FIG. 25, the reference voltages $V_A$ and $V_B$ must be changed by adjusting the variable resistances $VR_A$ and $VR_B$ so as to change the positions of the key top 1 where the on and off signals are generated. The on/off determination can be performed by arithmetically comparing the predetermined constant (reference voltage $V_A$ or $V_B$) with the magnitude of the position data (positional signal voltage X), and the positions of the key top 1 where the on and off signals are generated can be readily changed by changing the constant. Furthermore, as compared with the on/off signal generation means which employs an electrical contact, prevention of chattering is facilitated.

Figure 27:
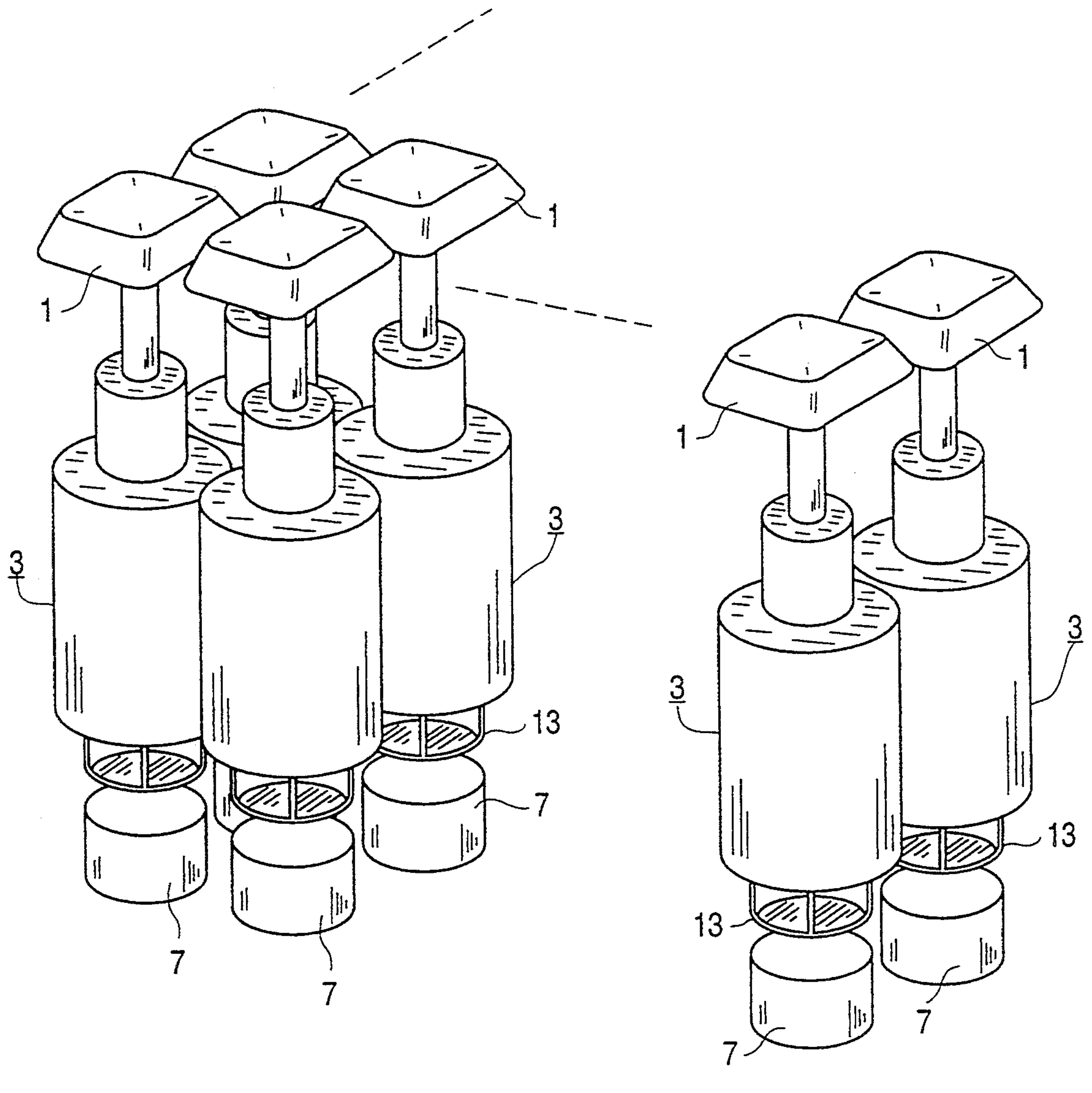
FIG. 27 is a schematic perspective view illustrating an example of a keyboard consisting of a plurality of key blocks 100.

FIG. 27 is a perspective view of an eighth embodiment of the present invention. FIG. 27 illustrates how a plurality of key blocks 100 described in either of the aforementioned embodiments are arranged. In FIG. 27, identical reference numerals as those in FIGS. 1 through 26 represent similar or identical elements.

In the key block 100 in the first to seventh embodiments, the key force profile can be freely set. Thus, provision of a plurality of such key blocks 100 enables the operator to readily experience different types of key touches. If the on/off determination means 43 described in the sixth or seventh embodiment is added to each of the key tops 1 of the individual key blocks 100, such a plurality of key blocks can be connected to a computer or a word processor and be used as a normal keyboard. In that case, it is possible according to the present invention to set the resistive force generated by the plurality of key blocks 100 by a single force setting means 4. It is also possible according to the present invention to set the key force profiles for the individual key tops 1 independently of each other. Consequently, the resistive force of the key top to be operated by the little finger may be reduced to that of the other key tops. Such a setting or adjustment can be performed by the operator freely and rapidly according to the environmental and physical conditions.

what is claimed is:

1. A method of providing a key-force profile characteristic for a key top which is displaced by an externally applied depressing force, said method comprising the steps of:

(a) detecting the position of the key top and outputting positional data corresponding to the position of the key top;

(b) converting the positional data into a resistive force value in accordance with a predetermined relationship between the resistive force value and the positional data; and (c) applying to the key top a resistive force in accordance with the resistive force value.

2. A method according to claim 1, wherein said step (b) further includes a substep of outputting an ON signal or an OFF signal on accordance with a result obtained by comparing the positional data with a predetermined value.

3. A device for providing a key-force profile characteristic for a key top which is displaced by an externally applied depressing force, said device comprising:

(a) position detection means for detecting the position of the key top and outputting positional data corresponding to the displacement of the key top;
(b) force generation means for applying a resistive force to the key top;
(c) force setting means for converting the positional data into a resistive force value in accordance with a predetermined relationship between the resistive force value and the positional data; and
(d) driving means for driving the force generation means in accordance with the resistive force value set by the force setting means.

4. A device according to claim 3, further comprising state determination means having a first state and a second state, wherein said state determination means changes from the first state to the second state when the positional data output from the position detection means becomes greater than a first predetermined value, or changes from the second state to the first state when the positional data output from the position detection means becomes smaller than a second predetermined value.

5. A device according to claim 4, wherein said state determination means remains at the first state until the key top passes through a predetermined first position and changes to the second state when the key top passes through the predetermined first position and keeps the second state until the key top passes through a predetermined second position, thereby eliminating a chattering phenomenon caused by the change between the two states in a short time.

6. A device according to claim 5, wherein said state determination means includes two comparators for comparing the positional data output from the position detection means with two different reference voltages, and a set/reset flip-flop into which the outputs of said two comparators are input as a set signal and a reset signal, respectively.

7. A device according to claim 3, wherein said position detection means is arranged such that it detects a position of a target which is displaced together with the key top.

8. A device according to claim 3, wherein said force generation means comprises an electromagnetic actuator which generates the resistive force by a current applied thereto from said driving means.

9. A device according to claim 8, wherein said driving means supplies a current of two polarities to said force generation means.

10. A device according to claim 3, wherein said position detection means outputs analog positional data, and wherein said force setting means includes conversion means comprising:

a memory for storing a plurality of predetermined force data, each assigned an address;
an analog-to-digital converter for converting the positional data output from said position detection means into a digital value corresponding to one of the addresses; and
a digital-to-analog converter for converting one of the plurality of predetermined force data, read from the memory in accordance with the digital value of the positional data, into a corresponding analog signal for driving said driving means.

11. A device according to claim 10, wherein said memory has address lines and data lines, said analog-to-digital converter has an output including a plurality of digits connected to respective ones of the address lines, and said digital-to-analog converter has an input including a plurality of digits connected to respective ones of the data lines.

12. A device according to claim 11, wherein said force setting means includes force control means comprising address setting means for setting an address of said memory where digital data corresponding to the resistive force valve is stored, data setting means for setting the resistive force data in the address set by said address setting means, and memory control means for controlling writing to and reading from the memory.

13. A device according to claim 12, wherein said force control means further comprises hysteresis setting means which operates to add a first biasing force to the resistive force when the key top, moving in a first direction, passes through a predetermined first position and to add a second biasing force to the resistive force when the key top, moving in a second direction opposite to the first direction, passes a predetermined second position, whereby a key-force profile characteristic having a hysteresis characteristic is provided for the key top.

14. A device according to claim 13, wherein said memory has a further address line, and said hysteresis setting means has an output connected to the further address line, whereby at least one of the addresses is shifted by a value determined by the hysteresis setting means.

15. A device according to claim 14, wherein said hysteresis setting means includes two comparators for comparing the positional data output from the position detection means with two different reference voltages, and a set/reset flip-flop into which the outputs of the two comparators are input as a set signal and a reset signal, respectively.

16. A device according to claim 3, further comprising depressing force detection means for detecting a magnitude of the depressing force applied to the key top, and display means for displaying a profile curve of the depressing force and the displacement of the key top.

17. A device according to claim 3, wherein said position detection means outputs analog positional data, and said force setting means comprises:

an analog-to-digital converter for converting the analog positional data output from the position detection means into a corresponding digital value;
a control computer for converting the digital value corresponding to the analog positional data output from said analog-to-digital converter into the resistive force value in accordance with a predetermined relationship between the resistive force value and the positional data; and
a digital-to-analog converter for converting the resistive force value into a corresponding analog value for driving the driving means.

18. A device according to claim 17, wherein said control computer sets a table of predetermined force data having one to one correspondence to the positional data for realizing the key-force profile characteristic, and sends out an ON or OFF signal by referring to the table in accordance with the positional data.

19. A device according to claim 17, wherein said control computer has a program which provides a corrected resistive force value corresponding to the resistive force value multiplied by a predetermined coefficient or added to a predetermined constant, for eliminating errors due to fluctuations in hardware including the force generation means and the driving means.

20. A device according to claim 17, wherein said control computer has at least first and second numerical arrays each comprising a plurality of resistive force values corresponding to the positional data, the first and second numerical arrays being different from each other such that each of the resistive force values of the first numerical array corresponds to a larger magnitude of the resistive force applied to the key top than the resistive force valves of the second numerical array with respect to each of the positional data, and wherein said control computer selects the first numerical array during a period from when the key top, starting at an initial position, moves in a first direction to when the key top moving in the first direction reaches a first predetermined position, and alternatively selects the second numerical array during a period from when the key top moving in the first direction passes through the first position to when the key top moving back in a second direction opposite to the first direction reaches a second predetermined position which is nearer than the first position with respect to the initial position, whereby a key-force profile characteristic having a hysteresis characteristic is provided for the key top.

21. A device according to claim 3, further comprising a stopper means for controlling a range in which the key top is displaced, position adjusting means for adjusting a position of the stopper means, and stopper position detection means for detecting the position of the stopper means.

22. A device according to claim 3, further comprising a spring for applying an additional resistive force to the key top.

23. A device for realizing a key-force profile characteristic in a keyboard including a plurality of key tops each of which is displaced by an externally applied depressing force, comprising:

(a) a plurality of position detection means connected to and corresponding to the key tops, respectively, each of the position detection means detecting the position of the corresponding key top and generating corresponding positional data;

(b) a plurality of force generation means corresponding to the key tops, respectively, each for respectively applying a resistive force to the corresponding key top;

(c) force setting means for receiving the plurality of positional data corresponding to each of the key tops and converting the positional data into a plurality of resistive force values respectively in accordance with a predetermined relationship between the resistive force values and the plurality of positional data; and (d) a plurality of driving means corresponding to the force generation means, respectively, each for respectively driving the corresponding force generation means in accordance with the resistive force value set by the force setting means.

24. A device according to claim 23, wherein the force setting means uses another predetermined relationship between the positional data and the resistive force values to at least one key top so that the magnitude of the resistive force applied to the at least one key top differs from those applied to the rest of the key tops.

25. A method of providing a key force profile characteristic for a key top which is displaced by an externally applied depressing force, said method comprising the steps of:

(a) setting a table comprising a plurality of resistive force values and corresponding positional data each having one to one correspondence to a plurality of predetermined positions of the key top;

(b) detecting the position of the key top and generating corresponding positional data;

(c) converting the positional data into a resistive force value with reference to the table set in step (a); and (d) applying to the key top a resistive force controlled in accordance with the resistive force value obtained in step (c).

26. A method according to claim 25, wherein said step (b) further includes a substep of outputting an ON signal or an OFF signal in accordance with a result obtained by comparing the positional data with a predetermined value.

* * * * *

UNITED STATES PATENT AND TRADEMARK OFFICE

CERTIFICATE OF CORRECTION

PATENT NO. : 5,434,566

DATED : July 18, 1995

INVENTOR(S) : IWASA et al.

It is certified that error appears in the above-indentified patent and that said Letters Patent is hereby corrected as shown below:

Col. 1, line 37, change "an" to --on--.

Col. 5, line 8, change "17" to --17;--.

Col. 8, line 22, change "ADS70" to --AD570--;
line 47, change "$D_O$" to --$D_0$--.

Col. 15, line 7, change "$X<V_A$" to --$X>V_A$--.

Col. 16, line 63, change "on" to --in--.

Col. 19, line 9, change "valves" to --values--.

Signed and Sealed this

Thirteenth Day of February, 1996

*Attest:*

BRUCE LEHMAN

*Attesting Officer* *Commissioner of Patents and Trademarks*